(12) United States Patent
Kizer

(10) Patent No.: US 6,636,098 B1
(45) Date of Patent: Oct. 21, 2003

(54) DIFFERENTIAL INTEGRATOR AND RELATED CIRCUITRY

(75) Inventor: Jade Kizer, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/002,007

(22) Filed: Dec. 5, 2001

(51) Int. Cl.$^7$ ................................. G06F 7/64
(52) U.S. Cl. ................. 327/345; 327/333; 327/589; 330/258
(58) Field of Search ..................... 327/321–323, 327/345, 52, 54, 56, 482, 485–488, 307–312, 316–319, 589; 330/252, 258, 259

(56) References Cited

U.S. PATENT DOCUMENTS

| | | | | |
|---|---|---|---|---|
| 5,381,114 A | * | 1/1995 | Pena-Finol et al. | 330/258 |
| 5,412,348 A | * | 5/1995 | Kasha et al. | 330/288 |
| 6,014,042 A | | 1/2000 | Nguyen | 327/3 |
| 6,111,445 A | | 8/2000 | Zerbe et al. | 327/231 |
| 6,125,157 A | | 9/2000 | Donnelly et al. | 375/371 |
| 6,232,796 B1 | | 5/2001 | Batra et al. | 326/93 |
| 6,307,430 B1 | * | 10/2001 | Thomsen et al. | 330/9 |
| 6,346,856 B1 | * | 2/2002 | Myers et al. | 330/252 |
| 6,362,688 B1 | * | 3/2002 | Au | 330/261 |
| 6,380,806 B1 | * | 4/2002 | Ang | 330/258 |

OTHER PUBLICATIONS

Louis Luh et al., "A Continuous–Time Common–Mode Feedback Circuit (CMFB) for High–Inpedance Current––Mode Applications", IEEE Transaction on Circuits and Systems–II: Analog and Digital Signal Processing, vol. 47, No. 4, 2000, pp. 363–370.

K. Strohbehn et al., "Field Programmable Mixed Signal Arrays for Space Applications", pp. 1–5.

W. Grise, "Application of the Operational Transconductance Amplifier (OTA) to Voltage–controlled Amplifiers and Active Filters", pp. 1–10, <http://et.nmsu.edu/~etti/winter98/electronic/grise/wrg.html>.

* cited by examiner

Primary Examiner—My-Trang Nuton
(74) Attorney, Agent, or Firm—Hunton & Williams LLP

(57) ABSTRACT

An improved differential integrator and related circuitry is disclosed. In one exemplary embodiment, the improved differential integrator comprises an integrating gain boosted cascode circuit for receiving an input signal having a first locking time and for generating an output signal having a second locking time, wherein the second locking time being delayed by a predetermined amount from the first locking time. The improved differential integrator may also comprise a multi-node common-mode feedback circuit, and a dynamic cascode common-mode feedback circuit. The integrating gain boosted cascode circuit may include a gain boosted cascode structure and a capacitor compensation structure. The multi-node common-mode feedback circuit may include a folded cascode circuit. The dynamic cascode common-mode feedback circuit may include a cascode circuit that uses common-mode feedback.

56 Claims, 20 Drawing Sheets

DIFFERENTIAL INTEGRATOR AND RELATED CIRCUITRY

FIELD OF THE INVENTION

The present invention relates generally to electronic devices and circuits and, more particularly, to an improved differential integrator and related circuitry.

BACKGROUND OF THE INVENTION

As electronics continue to get faster, more data is required to travel between the chips that process the data. In order to reliably transmit or receive the data, a clock signal is typically sent with the data. If only one edge of the clock signal is used for synchronizing the data, the clock signal frequency will need to be twice the frequency of the data. This doubling of clock signal frequency can easily become the system limiting factor because higher frequency signals are harder to transmit.

The clock signal can be slowed to the same frequency of the data if both edges of the clock signal are used to synchronize the data. However, this requires that both halves of the clock signal have an equal 50%/50% duty cycle, so that each piece of data has a maximum transmit or receive time. A duty cycle corrector can correct a bad clock signal by measuring the on-time and the off-time of the clock signal, and then adjusting the clock signal until the on-time and off-time are equal, thus producing an equal 50%/50% duty cycle clock signal.

The key to achieving accurate clock signal correction is an integrator. That is, an integrator is used to measure the on-time and the off-time of a clock signal, and an error signal is generated if the two are not equal. The integrator may be single-ended or differential, but in either case, as technology advances, it actually gets more difficult to make high quality integrators. This is due to several factors, including the following: voltages being reduced; devices getting smaller; some physical parameters not changing as fast as others; leakage currents; and less ideal devices. To overcome these limitations, new circuit techniques are needed to produce an integrator with small internal error. Currently, without these new circuit techniques, duty cycle errors of two percent are not uncommon, and this problem will only get worse as technology continues to advance.

For example, when using a differential integrator to generate an error voltage, a large output swing is desired to reduce jitter caused by differential noise and power supply noise. For maximum differential output range of a differential integrator, output common-mode should be at one-half the operating voltage (i.e., $\frac{1}{2}V_{DD}$) to provide maximum saturation voltage for nmos and pmos current sources performing the integration. However, the generated voltage must drive a differential-pair to perform the correction for which it was established. In low voltage (i.e., less than 2 volts as measured between a transistor gate and source) applications, neither an nmos nor pmos differential-pair will operate in a dead band region centered around $\frac{1}{2}V_{DD}$. Additionally, because the integrator is integrating charge, any differential charge that is output thereby directly translates into an integrating error. This means that traditional methods of level shifting fail. For example, a source-follower is differentially range limited because it is single ended, and a resistive divider causes a differential current error. As a result, an alternative is needed to achieve maximum output range.

Another problem arises when a large output swing is desired, which is especially true in low-voltage applications. A small overdrive voltage for transistors operating as current-sources requires a large transistor width/length (W/L) ratio. To save area and parasitic capacitance (e.g., speed and charge injection errors), a small L is used and only constrained by the matching desired. This now means that channel-length modulation (CLM) is the dominant source of mismatch between the differential current sources. This too must be reduced for a high-precision integrator (i.e., an integrator used to correct duty cycle error to less than two percent for all corners of operation, with that percentage of error potentially increasing as technology advances). In general, as mentioned above, analog circuits keep becoming more difficult to make as the operating voltage (i.e., $V_{DD}$) scales, but threshold voltage (i.e., $V_t$) does not.

At this point it should be noted that duty cycle correction is not the only place to use a high precision integrator. They can be used in other applications where the timing of one event needs to match another event. For example, one such application is an analog phase detector where two edges are adjusted with 90 degrees of phase offset between them (e.g., a quadrature phase detector). In this application, as with the duty cycle correction application, new circuit techniques are needed to produce an integrator with small internal error.

In view of the foregoing, it would be desirable to provide an improved differential integrator which overcomes the above-described inadequacies and shortcomings in an efficient and cost effective manner.

SUMMARY OF THE INVENTION

According to the present invention, an improved differential integrator and related circuitry is provided. In one exemplary embodiment, the improved differential integrator comprises an integrating gain boosted cascode circuit for receiving an input signal having a first locking time and for generating an output signal having a second locking time, wherein the second locking time being delayed by a predetermined amount from the first locking time.

According to other aspects of this exemplary embodiment of the present invention, the improved differential integrator further comprises a multi-node common-mode feedback circuit that is coupled to the integrating gain boosted cascode circuit. The multi-node common-mode feedback circuit receives at least one bias signal and reduces offset in a desired common-mode of the output signal based thereon.

According to further aspects of this exemplary embodiment of the present invention, the improved differential integrator further comprises a dynamic cascode common-mode feedback circuit that is coupled to the integrating gain boosted cascode circuit and the multi-node common-mode feedback circuit. The dynamic cascode common-mode feedback circuit compares the output signal and a reference voltage and generates the at least one bias signal in response thereto.

According to still further aspects of this exemplary embodiment of the present invention, the improved differential integrator further comprises a nap mode circuit that is coupled to the integrating gain boosted cascode circuit and the multi-node common-mode feedback circuit. The nap mode circuit receives a feedback signal and a nap signal and determines a sleep mode based thereon, wherein a differential charge associated with the output signal and the second locking time is stored during the sleep mode.

According to still further aspects of this exemplary embodiment of the present invention, the improved differential integrator further comprises a level shifter circuit that is coupled to the integrating gain boosted cascode circuit.

The level shifter circuit level shifts the output signal so as to generate a level shifted output signal.

According to still further aspects of this exemplary embodiment of the present invention, wherein the integrating gain boosted cascode circuit is a first integrating gain boosted cascode circuit, the improved differential integrator further comprises a second integrating gain boosted cascode circuit that is coupled to an output node of the first integrating gain boosted cascode circuit. The second integrating gain boosted cascode circuit generates a pair of output signals.

According to another exemplary embodiment of the present invention, an integrating gain boosted cascode circuit is provided comprising a gain boosted cascode structure for receiving substantially equal input voltages and for generating a differential voltage to compensate for channel length modulation. The integrating gain boosted cascode circuit also comprises a capacitor compensation circuit, coupled to an output of the gain boosted cascode structure, for generating an output slew rate of the differential voltage which is slower than an input slew rate of the input voltages such that the differential voltage is a time-averaged gain boosted differential voltage.

According to another exemplary embodiment of the present invention, a multi-node common-mode feedback circuit is provided comprising common-mode feedback circuitry for determining a difference between an input voltage and a reference voltage and for adjusting at least one current branch based on the difference. The multi-node common-mode feedback circuit also comprises at least one current source, coupled to the common-mode feedback circuitry, for receiving at least one current signal via the at least one current branch, wherein a first current branch and a second current branch are adjusted simultaneously to compensate for common-mode correction.

According to another exemplary embodiment of the present invention, a dynamic cascode common-mode feedback circuit is provided comprising common-mode feedback circuitry for receiving an input signal and a reference signal, for determining a difference between the input signal and the reference signal, and for generating a first bias signal for driving a cascoded current source and a second bias signal that varies dynamically with the first bias signal for driving a second current source based upon the difference.

According to another exemplary embodiment of the present invention, a nap mode circuit is provided comprising logic circuitry for receiving a nap signal and a feedback signal and for determining a power save mode based thereon. The nap mode circuit also comprises storage circuitry, coupled to the logic circuitry, for storing a differential charge by disconnecting a differential path during the power save mode, wherein a differential voltage is held constant prior to a wake-up mode to shorten wake-up time.

According to another exemplary embodiment of the present invention, a level shifter circuit for level shifting differential signals is provided comprising first charge storage circuitry for receiving differential signals at an input node. The level shifter circuit also comprises charge pump circuitry, coupled to the first charge storage circuitry, for level shifting the differential signals and for generating level shifted differential signals. The level shifter circuit further comprises second charge storage circuitry, coupled to the charge pump circuitry, for storing the level shifted differential signals and for generating output signals to an output node based thereon. The level shifter circuit further comprises at least one pair of switches coupled to the charge pump circuitry for enabling charge to flow between the input node and the output node so as to establish an equilibrium therebetween.

According to another exemplary embodiment of the present invention, a method for reducing offset in a desired common-mode of a differential integrator is provided comprising the steps of: receiving an input signal having a first locking time; generating an output signal, based upon the input signal, having a second locking time, the second locking time being delayed by a predetermined amount from the first locking time; comparing the output signal and a reference voltage; generating at least one bias voltage signal in response to the comparison; and reducing offset in a desired common-mode based on at least one of the at least one bias voltage signal.

According to another exemplary embodiment of the present invention, a method for generating a time-average gain boosted differential voltage in an integrating gain boosted cascode circuit is provided comprising the steps of: receiving substantially equal input voltages; generating a differential voltage, based upon the input voltages, to compensate for channel length modulation; and generating an output slew rate of the differential voltage which is slower than an input slew rate of the input voltages such that the differential voltage is a time-averaged gain boosted differential voltage.

According to another exemplary embodiment of the present invention, a method for compensating for common-mode correction in a multi-node common-mode feedback circuit is provided comprising the steps of: determining a difference between an input voltage and a reference voltage; adjusting at least one current branch based on the difference; and receiving at least one current signal via the at least one current branch, wherein a first current branch and a second current branch are adjusted simultaneously to compensate for common-mode correction.

According to another exemplary embodiment of the present invention, a method for generating a constant overdrive voltage in a dynamic cascode common-mode feedback circuit is provided comprising the steps of: receiving an input signal and a reference signal; determining a difference between the input signal and the reference signal, and generating a first bias signal for driving a cascoded current source and a second bias signal that varies dynamically with the first bias signal for driving a second current source based upon the difference.

According to another exemplary embodiment of the present invention, a method for implementing a nap circuit is provided comprising the steps of: receiving a nap signal and a feedback signal; determining a power save mode based upon the nap signal and the feedback signal; and storing a differential charge by disconnecting a differential path during the power save mode, wherein a differential voltage is held constant prior to a wake-up mode to shorten wake-up time.

According to another exemplary embodiment of the present invention, a method for level shifting differential signals is provided comprising the steps of: receiving differential signals at an input node; level shifting the differential signals; storing the level shifted differential signals; generating output signals to an output node based upon the stored level shifted differential signals; and enabling charge to flow between the input node and the output node so as to establish an equilibrium therebetween.

The present invention improved differential integrator may be used in different types of circuits such as, for example, duty cycle correctors and charge pumps for phase locked loops. It is particularly useful for low voltage (e.g., less than 2 volts as measured between a transistor gate and source), high precision (e.g., 1% to 2%) applications. Also, some of the aforementioned circuits may be implemented in other circuits such as, for example, the integrating gain boosted cascode circuit, the multi-node common-mode feedback circuit, the dynamic cascode common-mode feedback circuit, the nap mode circuit, and the level shifter circuit.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Figure 1:
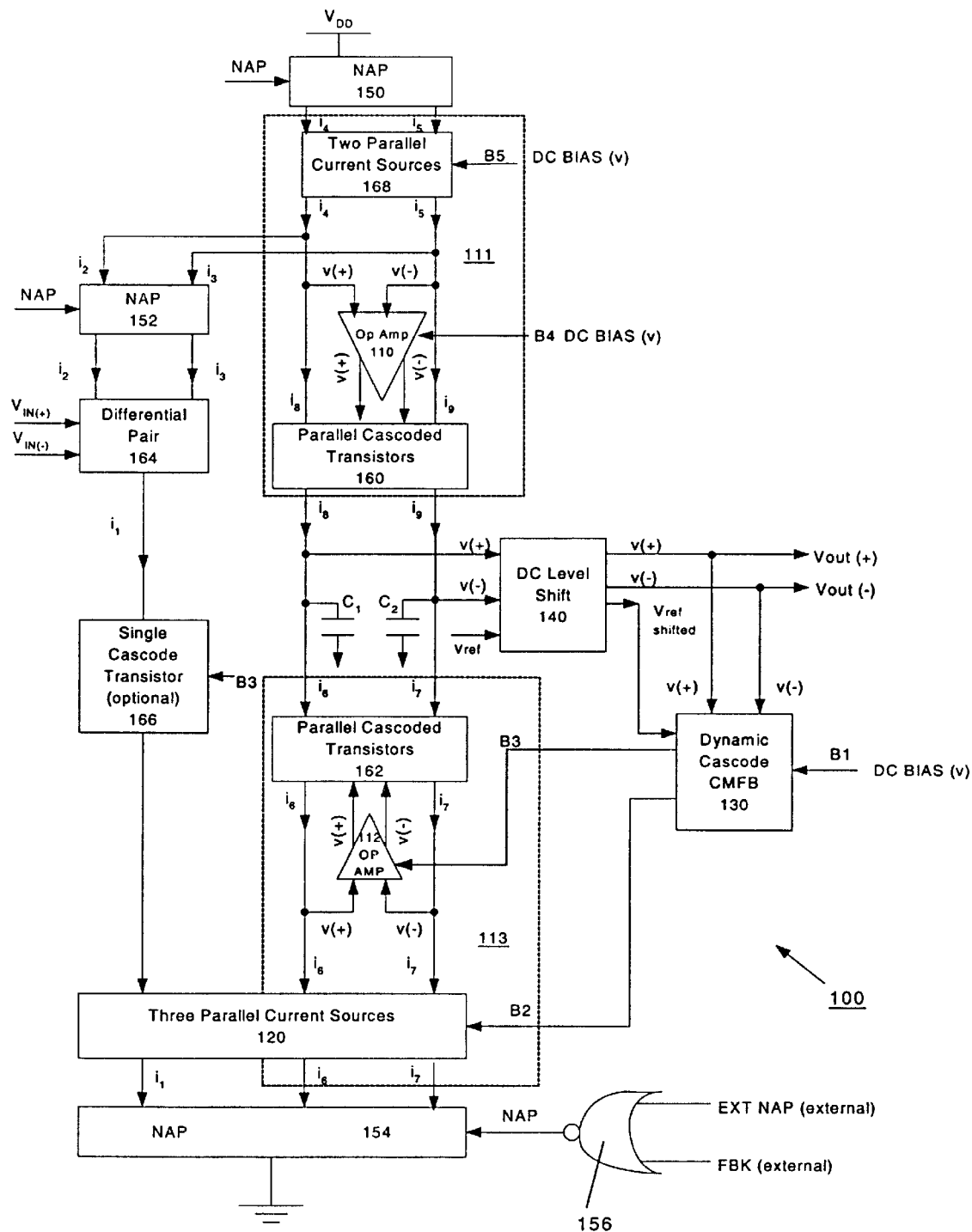
FIG. 1 is an improved differential integrator in accordance with the present invention.

FIG. 1 is an example of a differential integrator 100 in accordance with an embodiment of the present invention. The differential integrator 100 comprises a differential pair input circuit 164, a first integrating gain boosted cascode circuit 111, a second integrating gain boosted cascode circuit 113, a multi-node common-mode feedback circuit 120, a dynamic cascode common-mode feedback circuit 130, a DC level shifter circuit 140, and nap mode sleep and wake circuitry 150, 152, 154, and 156.

At this point it should be noted that the differential integrator 100 shown in FIG. 1 utilizes a fully-differential gain-boosted topology so as to mitigate CLM effects. However, it should also be noted that the present invention supports other topologies such as, for example, a partially-differential gain-boosted topology or a single-ended gain-boosted topology.

The differential pair input circuit 164 may be implemented with transconductance circuitry. The differential pair input circuit 164 may be accompanied by an optional single cascoded transistor 166, which may also be implemented with transconductance circuitry.

The first integrating gain boosted cascode circuit 111 comprises an operational amplifier 110, parallel cascoded transistors 160, and two parallel current sources 168. The parallel cascoded transistors 160 and the two parallel current sources 168 may be implemented with transconductance circuitry.

The second integrating gain boosted cascode circuit 113 comprises an operational amplifier 112, parallel cascoded transistors 162, and two parallel current sources within the multi-node common-mode feedback circuit 120. The parallel cascoded transistors 162 and the two parallel current sources within the multi-node common-mode feedback circuit 120 may be implemented with transconductance circuitry.

The multi-node common-mode feedback circuit 120 comprises three parallel current sources. As described above, two of the three parallel current sources in the multi-node common-mode feedback circuit 120 are utilized to implement second integrating gain boosted cascode circuit 113. A third of the three parallel current sources in the multi-node common-mode feedback circuit 120 is utilized to supplement the differential pair input circuit 164.

The specific implementation details of the dynamic cascode common-mode feedback circuit 130, the DC level shifter circuit 140, and the nap mode sleep and wake circuitry 150, 152, 154, and 156 will be described in detail below when describing the operation of the differential integrator 100.

At this point it should be noted that, although the differential integrator 100 is shown in FIG. 1 comprising the differential pair input circuit 164, the first integrating gain boosted cascode circuit 111, the second integrating gain boosted cascode circuit 113, the multi-node common-mode feedback circuit 120, the dynamic cascode common-mode feedback circuit 130, the DC level shifter circuit 140, and the nap mode sleep and wake circuitry (NAP) 150, 152, 154, and 156, alternative differential integrators may be implemented using less than all of the above-mentioned circuits in accordance with the present invention as described in detail below. It should also be noted that each of the above-mentioned circuits may be used for purposes other than in a differential integrator. In fact, each of the above-mentioned circuits is considered novel in and of itself.

As shown in FIG. 1, differential input voltage signals Vin(+) and Vin(−) are inputs to the differential pair input circuit 164, which preferably functions as a differential voltage-to-current converter. The differential pair input circuit 164 generates an output current signal i1. Output current signal i1 is an input to the multi-node common-mode feedback circuit 120, which preferably functions as a current sink. A function of the differential pair input circuit 164 may include converting differential input current signals i2 and i3 into the output current signal i1. The differential pair input circuit 164 may achieve a power supply rejection wherein noise that is common mode to both differential input current signals i2 and i3 is rejected. Differential input current signals i2 and i3 are added together to obtain output current signal i1. For example, when i1=100 mA and Vin(+)=0 and Vin(−)=0, then i2=50 mA and i3=50 mA. In another example, if a differential difference between Vin(+) and Vin(−) equals 10 millivolts, by multiplying the differential difference by a magnitude (or value) of the transconductance in the differential pair input circuit 164, a difference between i2 and i3 may be realized thereby producing a pair of differential signals. Thus, the differential pair input circuit 164 controls the amount of current between i2 and i3, wherein i2+i3 =i1.

As previously mentioned, the differential pair input circuit 164, the optional single cascoded transistor 166, the parallel cascoded transistors 160, the two parallel current sources 168, the parallel cascoded transistors 162, and the three parallel current sources within the multi-node common-mode feedback circuit 120 may all be implemented with transconductance circuitry. Transconductance generally represents the performance of a transistor (e.g., bipolar transistor, field-effect transistor). Transconductance may be defined as a change in collector or drain current (dI) caused by a small change in base or gate voltage (dE) represented by:

$$gm=dI/dE$$

Thus, the differential pair input circuit 164 receives the differential input current signals i2 and i3 and outputs the proportional output current signal i1 based on differential voltages Vin(+) and Vin(−). Depending on the difference between differential input voltage signals Vin(+) and Vin(−), the differential pair input circuit 164 provides a proportional difference in current. For example, if differential input voltage signals Vin(+) and Vin(−) are equal, then differential input current signals i2 and i3 may each be half of output current signal i1.

The optional single cascoded transistor 166 receives input current signal i1 and generates output current signal i1. That is, the cascode structure optional single cascoded transistor 166 generates an output signal that is the same as an input signal. The optional single cascoded transistor 166 is used to provide a more constant current source when implemented. The optional single cascoded transistor 166 receives bias voltage B3 and generates an output voltage that is dependent on bias voltage B3. The output voltage that is generated by the optional single cascoded transistor 166 causes a more constant drain to source voltage in the corresponding current source within the multi-node common-mode feedback circuit 120, which results in a higher output resistance.

A common gate on top of a common source in the optional single cascoded transistor 166 forces a source voltage to be a certain voltage wherein a gate to source voltage is a well defined function. This forced source voltage provides a more constant current source.

In summary, the optional single cascoded transistor 166 receives bias voltage B3 and defines an output voltage (e.g., source voltage). The corresponding current source within the multi-node common-mode feedback circuit 120 functions as an ideal current source wherein the output voltage of the optional single cascoded transistor 166 is set to be substantially the same as the other inputs (i6 and i7) to multi-node common-mode feedback circuit 120. The optional single cascoded transistor 166 serves to set the voltage while the corresponding current source within the multi-node common-mode feedback circuit 120 serves to set the current. The optional single cascoded transistor 166 is considered optional because the differential pair input circuit 164 may also set the voltage.

If the NAP circuitry 152 is in an open state, i2 and i3 are both equal to zero. As a result, no current flows through the differential pair input circuit 164. For example, it may be desirable to prevent current from flowing out of C1 and C2 by cutting current paths where voltage may be stored at ½$V_{DD}$. To effectively control the differential integrator 100, a differential voltage needs to be spread around ½$V_{DD}$. If top and bottom current paths are cut, then no current flows to/from the supply rails. Rather, current may work around and through the NAP circuitry 152. As a result, differential voltage will be shorted and voltage stored on C1 and C2 will be lost.

The NAP circuitry 150, 152, 154., and 156 operates to store differential charge inside the differential integrator 100 during a sleep mode. An external feedback signal (FBK) may be delayed until external circuits are in wake mode. The NAP circuit 154 receives a NAP input signal, which is the result of an external NAP signal (EXTNAP) that is logically NORed with the external feedback signal (FBK). All of the NAP circuits 150, 152, 154, and 156 all work in concert, wherein all of the NAP circuits 150, 152, 154, and 156 are either in an on state (e.g., short circuit) or an off state (e.g., open circuit).

The multi-node common-mode feedback (CMFB) circuit 120 operates to combine common-mode feedback to more than one current branch on a folded cascode so as to reduce offset from a desired common-mode. A folded cascode may include multiple current sources, such as the three parallel current sources in the multi-node CMFB circuit 120 and the two parallel current sources 168 in the first integrating gain boosted cascode circuit 111.

Conventionally, a cascode circuit involves hooking up two transistors so that they act as a single device with improved characteristics. Essentially, a first stage of a cascode is a common-emitter and a second stage is a common-base. A base voltage of the second stage is connected to a DC potential or to a reference that varies with an emitter voltage of the first stage. A collector-emitter voltage of the first stage is nearly constant. Some advantages of a cascode circuit include improved linearity because a distortion-prone common-emitter is shielded from variations in collector-emitter voltage. The common-base stage itself is generally linear. Another advantage includes increased bandwidth because the first stage operates at low gain. The multi-node CMFB circuit 120 provides the same (or substantially similar) CMFB bias on input and output stages.

The multi-node CMFB circuit 120 is coupled to the dynamic cascode CMFB circuit 130 for receiving a bias signal B2. The bias signal B2 is dynamic to ensure constant overdrive voltage. The multi-node CMFB circuit 120 is also coupled to the second integrating gain boosted cascode circuit 113 and the NAP circuit 154. The multi-node CMFB circuit 120 is either coupled directly to the differential pair input circuit 164, or through the optional single cascoded transistor 166.

The NAP circuit 150 operates to control a pull-up current path while NAP circuit 154 operates to control a pull-down current path. As previously described, the NAP circuit 152 operates to control a differential current path. The NAP circuit 150 is coupled to the voltage supply $V_{DD}$ and controls current input signals i4 and i5 to the two parallel current sources 168 in the first integrating gain boosted cascode circuit 111. The NAP circuit 154 is coupled to ground and receives input current signal i1 and input current signal pair i6 and i7 from the multi-node CMFB 120.

When the NAP circuit 150 is in an on state, the supply current from voltage supply $V_{DD}$ is controlled by the two parallel current sources 168 in the first integrating gain boosted cascode circuit 111. When the NAP circuit 150 is in an off state, current input signals i4 and i5 are provided directly from the voltage supply $V_{DD}$ to the two parallel current sources 168 in the first integrating gain boosted cascode circuit 111. That is, when the NAP circuit 150 is in an off state, the NAP circuit 150 provides current input signals i4 and i5 to the two parallel current sources 168 in the first integrating gain boosted cascode circuit 111, wherein i4=i5.

The two parallel current sources 168 in the first integrating gain boosted cascode circuit 111 receive a DC bias signal B5. The DC bias signal B5 is set to obtain a desired current. That is, the two parallel current sources 168 in the first integrating gain boosted cascode circuit 111 function as an ideal current sources where the current being provided by the two parallel current sources 168 in the first integrating gain boosted cascode circuit 111 is equal to current being received by the multi-node CMFB circuit 120. The two parallel current sources 168 in the first integrating gain boosted cascode circuit 111 may also function as reference current sources in that the dynamic cascode common-mode feedback circuit 130 may adjust the current sources in the multi-node CMFB circuit 120 to be equal to that of the two parallel current sources 168 in the first integrating gain boosted cascode circuit 111.

The following equations apply to the differential integrator 100 of FIG. 1:

$$i4=i2+i8$$

$$i5=i3+i9$$

Output voltages may be set at a predetermined value. Input nodes to the operational amplifier 110 of the first integrating gain boosted cascode circuit 111 are shared by the two parallel current sources 168, the NAP circuit 152, and the parallel cascoded transistors 160. The input voltages V(+) and V(−) of the operational amplifier 110 are preferably equal to each other to ensure that the two parallel current sources 168 produce equal output currents. The operational amplifier 110 may have an input of V(+), V(−) and an output of V(+), V(−) with a gain associated with that of the operational amplifier 110.

A feedback path into the parallel cascoded transistors 160 forms a cascoded device. A gate voltage in the parallel cascoded transistors 160 may be adjusted to control the voltage seen by the two parallel current sources 168, depending on the magnitude of input voltages V(+) and V(−) to the parallel cascoded transistors 160. For example, a constant bias signal B4 applied to the operational amplifier 110 may be equal to 750 mV wherein a differential voltage spreads away from 750 mV (e.g., input V(+) approaches 800 mV and input V(−) approaches 700 mV so that the inputs to the op amp may be equal voltages). By spreading the voltage around bias signal B4, inputs to the operational amplifier 110 may be forced to approach each other.

Inputs V(+) and V(−) to the operational amplifier 110 are equal to the voltages at the inputs to the parallel cascoded transistors 160. That is, a controlling voltage path is formed around the operational amplifier 110, thereby providing a feedback path. The input currents to the parallel cascoded transistors 160 are current signals i8 and i9.

FIG. 1 shows both the first integrating gain boosted cascode circuit 111 and the second the first integrating gain boosted cascode circuit 113. However, either one or both of the first integrating gain boosted cascode circuit 111 and the second the first integrating gain boosted cascode circuit 113 may be implemented in differential integrator 100 in accordance with the present invention. Both the first integrating gain boosted cascode circuit 111 and the second the first integrating gain boosted cascode circuit 113 operate slower than the bandwidth of an incoming signal, but faster than the lock time of the differential integrator 100, thereby reducing DC offset.

As previously described, the two parallel current sources 168 provide equal current signals i4 and i5. However, an unequal amount of current may be drawn off as inputs to the differential pair input circuit 164. Thus, differential currents from the differential pair input circuit 164 may appear at the parallel cascoded transistors 160. As a result, current signals i8 and i9 may include unequal inputs to the parallel cascoded transistors 160. The output of the parallel cascoded transistors 160 includes current signals i8 and i9. Thus, a differential current will charge capacitors C1 and C2.

According to another embodiment of the present invention, the differential pair input circuit 164 may switch between giving all current to i2 and all current to i3. This behavior may be observed at the output of the parallel cascoded transistors 160. Thus, capacitors C1 and C2 may be charged with all the current on one input and all the current on the other input at a ½ frequency time period. For example, if i1=100 mA, then i4=100 mA or i5=100 mA from the two parallel current sources 168.

The parallel cascoded transistors 162 receive input current signals i6 and i7, wherein i6 and i7 are equal. Other inputs to the parallel cascoded transistors 162 include output voltages V(+) and V(−) from operational amplifier 112. The parallel cascoded transistors 162 also receives a bias signal B3 from the dynamic cascode CMFB circuit 130. The parallel cascoded transistors 162 generate output current signals i6 and i7, wherein i6 and i7 are equal. The parallel cascoded transistors 162 functions as a pair of constant current sources.

As previously described, the multi-node CMFB circuit 120 contains the three parallel current sources which function as a constant current sources. As a result, inputs i6 and i7 to the parallel cascoded transistors 162 function as two constant current sources. Inputs to the multi-node CMFB circuit 120 include i6 and i7, as well as i1 from the differential pair input circuit 164, or the optional single cascoded transistor 166. The output of the multi-node CMFB circuit 120 is coupled to the NAP circuit 154, which is coupled to ground.

The output current signals i8 and i9 from the parallel cascoded transistors 160 may be unequal, and the difference of signals i8 and i9 may be applied to capacitors C1 and C2. A differential voltage between C1 and C2 results, wherein the difference in voltage is an input to the DC level shifter circuit 140.

In low voltage applications, input voltage signals may be too low to drive a next circuit stage. Thus, the input voltage signals must be level shifted so that the next circuit stage may operate properly. In the differential integrator 100, the DC level shifter circuit 140 operates to accurately shift differential DC signals. That is, the DC level shifter circuit 140 receives differential DC signals and outputs level shifted differential DC signals. Thus, the DC level shifter circuit 140 provides output voltages Vout(+) and Vout(−), which are output from the differential integrator 100 and input to the dynamic cascode CMFB circuit 130. The DC level shifter circuit 140 also functions to level shift an reference voltage signal Vref, wherein Vref is preferably set at $\frac{1}{2}V_{DD}$.

The DC level shifter circuit 140 allows for maximum operating range. Also, the DC level shifter circuit 140 preferably has input voltage signals set at the middle of a supply voltage so as to provide a maximum amount of headroom.

The dynamic cascode CMFB circuit 130 is implemented to ensure a constant overdrive voltage for at least one cascoded current source. The dynamic cascode CMFB circuit 130 senses level-shifted output voltage signals V(+) and V(−) from the DC level shifter circuit 140. A level shifted reference voltage $V_{refshifted}$ may also serve as an input to the dynamic cascode CMFB circuit 130. Another input to the dynamic cascode CMFB circuit 130 may include a constant DC bias signal B1. The dynamic cascode CMFB circuit 130 generates bias signals B2 and B3 for the multi-node CMFB circuit 120 and the parallel cascoded transistors 162, respectively.

The dynamic cascode CMFB circuit 130 implements a current source that matches a current source of the two parallel current sources 168 and the parallel cascoded transistors 160, which use defined fixed bias signal B4 and B5. The bias signals B2 and B3 are adjusted to match bias signals B4 and B5. The level-shifted output voltage signals V(+) and V(−) from the DC level shifter circuit 140 are sensed by the dynamic cascode CMFB circuit 130 and compared to the level shifted reference voltage $V_{refshifted}$. When an average of the level-shifted output voltage signals V(+) and V(−) substantially equals the level shifted reference voltage $V_{refshifted}$, adjustment of B2 and B3 may stop or adjustment in an opposite direction may occur thereby resulting in a dynamic system. As a result, the average of the level-shifted output voltage signals V(+) and V(−) equals the level shifted reference voltage $V_{refshifted}$.

As the common mode (e.g., common mode may be defined as the average of two signals) of the level-shifted output voltage signals V(+) and V(−) approach closer to the level shifted reference voltage $V_{refshifted}$, the dynamic cascode CMFB circuit 130 will stop adjusting bias signals B2 and B3. As a feedback system, the dynamic cascode CMFB circuit 130 continuously adjusts to compensate for a difference between the average of the level-shifted output voltage signals V(+) and V(−) and the level shifted reference voltage $V_{refshifted}$.

In an alternative embodiment, as an average of the level-shifted output voltage signals V(+) and V(−) moves further away from the level shifted reference voltage $V_{refshifted}$, bias signals B2 and B3 may change in opposite directions to compensate for the difference. Bias signals B2 and B3 may be adjusted simultaneously, as a function of an overdrive voltage.

If a common mode is increasing, the parallel cascoded transistors 160 may pull up so as to provide an increase of power to the multi-node CMFB circuit 120 to compensate for the increase. For an increase in power to the multi-node CMFB circuit 120, the bias signals B2 and B3 may be accordingly increased. By increasing the bias signals B2 and B3, current signals i6 and i7 may be affected as a result. Voltage may be multiplied by the multi-node CMFB circuit 120 to produce currents such that i6 and i7 are still equal. The common mode is affected so that an average of two voltages is stored on capacitors C1 and C2.

Each component of the differential integrator 100 shown in FIG. 1 will now be described in further detail below.

Figure 2:
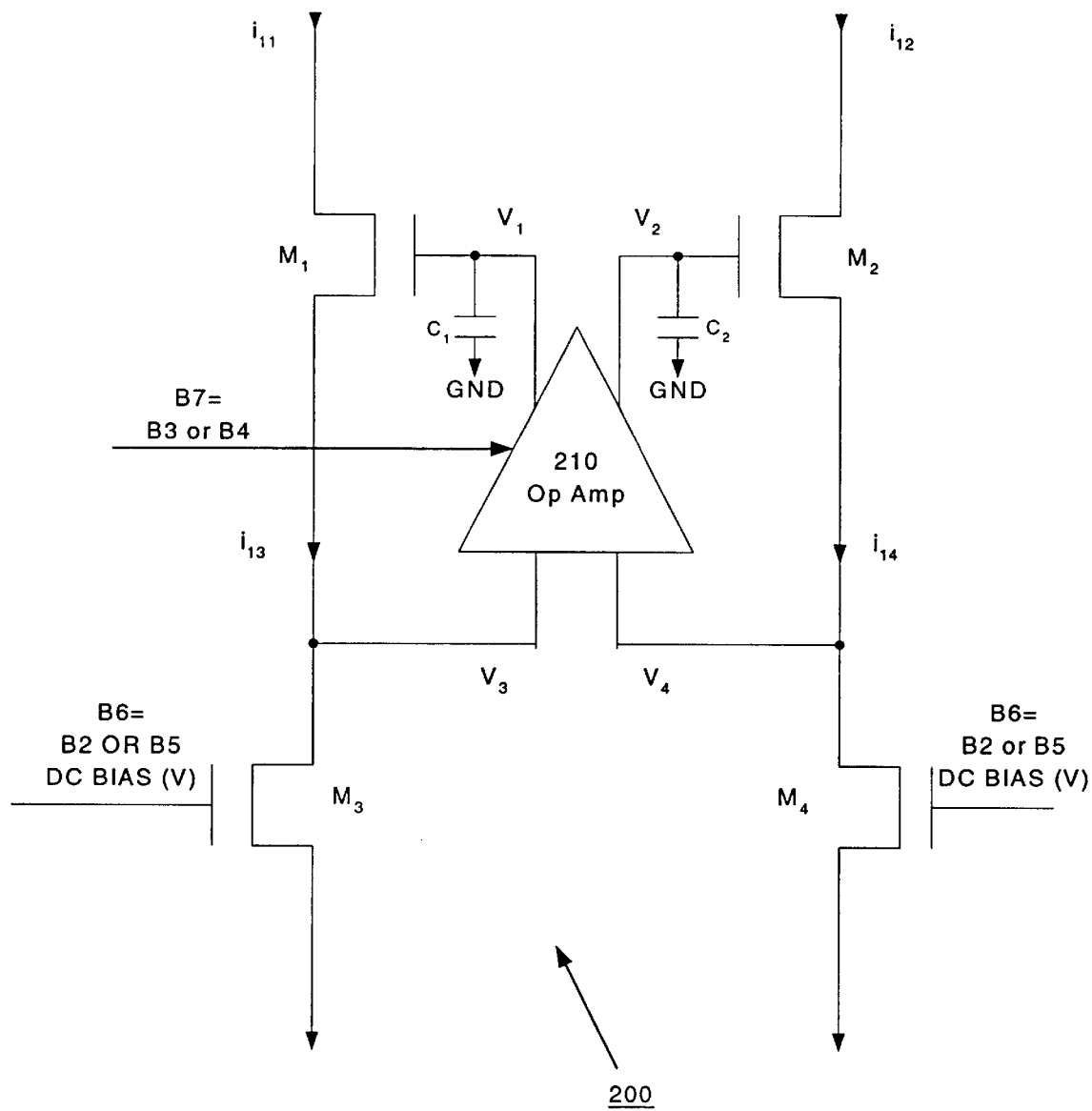
FIG. 2 is an example of an integrating gain boosted cascode circuit in accordance with the present invention.

FIG. 2 is an example of an integrating gain boosted cascode circuit 200 in accordance with the present invention. The integrating gain boosted cascode circuit 200 comprises an operational amplifier 210, a pair of capacitors C1 and C2, and a plurality of transistors M1–M4.

In the integrating gain boosted cascode circuit 200, gain boosting may be achieved in conjunction with a cascode architecture to reduce the effect of CLM by forcing a voltage seen by two differential current sources to be the same or substantially similar. Normally, when gain-boosting is used in a circuit, it must operate faster than the bandwidth of the incoming signal. However, when operating inside an integrator to reduce a DC offset due to CLM, the gain boosted cascode may operate faster than the locking time of the integrator, which is much slower than the bandwidth of the incoming signal. Thus, the speed of the gain boosted cascode may be decoupled from the speed of the incoming signal.

The integrating gain boosted cascode circuit 200 may provide for an incoming bandwidth that is faster than the integrating gain boosted cascode circuit 200. As the integrating gain boosted cascode circuit 200 may be faster than the lock time of an integrator, it may be used to reduce non-ideal $r_0$ of current sources.

The integrating gain boosted cascode circuit 200 may be ideal for low-voltage, small transistor sizes. The integrating gain boosted cascode circuit 200 generally differs from a normal gain boosting circuit by purposely loading the output of the integrating gain boosted cascode circuit 200 with capacitors. This ensures that the offset is adequately compensated.

In a conventional integrator that does not implement the integrating gain boosted cascode circuit 200, fast signals may steer an excess amount of current, thereby causing distortion, errors, and instability. The integrating gain boosted cascode circuit 200 provides a differential voltage with a correcting offset to minimize such distortion, errors, and instability.

The integrating gain boosted cascode circuit 200 shown in FIG. 2 is implemented as an integrator. The integrating gain boosted cascode circuit 200 utilizes capacitor C1 at V1 and capacitor C2 at V2. In the integrating gain boosted cascode circuit 200, the voltages at M3 and M4 are compared and accordingly adjusted until the voltages are equal (or substantially similar). Current sources may be made more equal to each other by adjusting the respective voltages so that equal currents/voltages are produced at the inputs to the operation amplifier 210. As a result, a differential voltage to compensate for CLM will develop between V1 and V2. The operational amplifier 210 may be bandwidth limited due to process limitations or compensation capacitors. Thus, the integrating gain boosted cascode circuit 200 will only be able to accurately amplify a non-periodic continuous-time signal with a bandwidth near or less than the unity-gain bandwidth of the operational amplifier 210. In other words, when changing signals are very fast, the operational amplifier 210 may produce a lag. In a periodic system, accuracy may be achieved by storing voltage or by time averaging the voltage at an output of the operational amplifier 210 via C1 and, C2, thereby producing the integrating function of the integrating gain boosted cascode circuit 200. According to an embodiment of the present invention, if capacitors are added at an output of the operational amplifier 210, performance of the circuit 200 may be enhanced. The capacitors may be formed inside the operational amplifier 210.

Figure 3A:
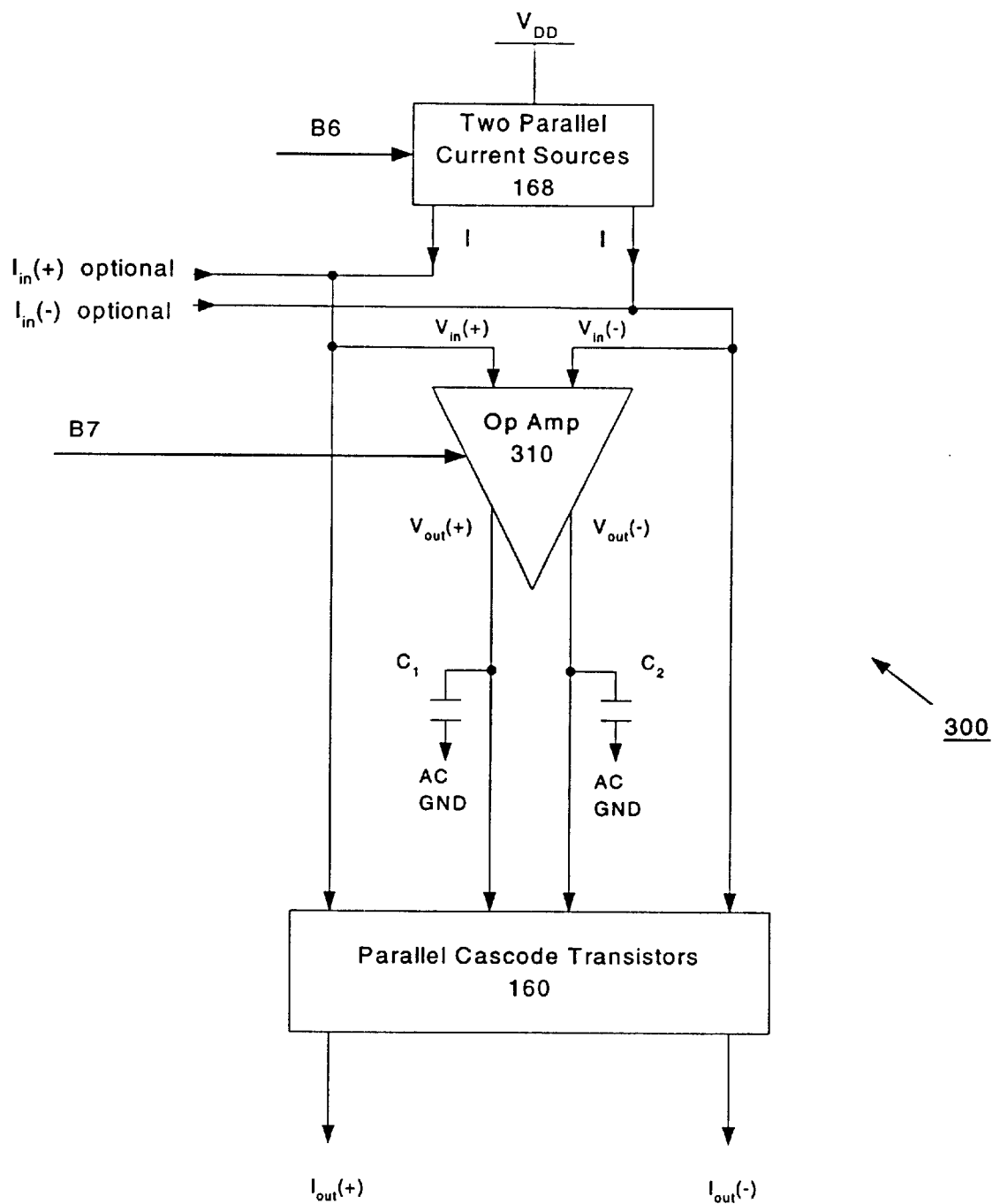
FIGS. 3a and 3b show implementations of integrating gain boosted cascode circuits in accordance with the present invention.
Figure 3B:
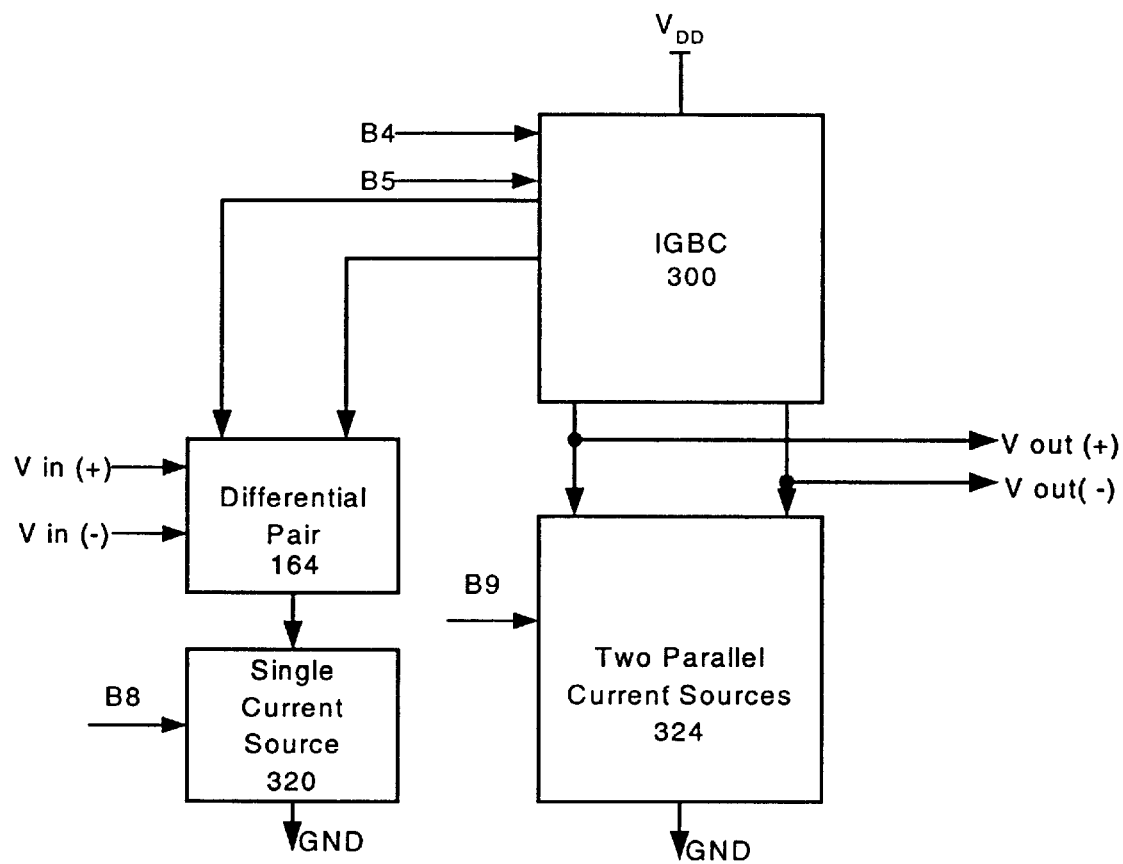

FIGS. 3a and 3b show implementations of integrating gain boosted cascode circuits in accordance with the present invention. The integrating gain boosted cascode circuit 300 of FIG. 3a represents a top integrating gain boosted cascode circuit implementation. Either a top or bottom integrating gain boosted cascode circuit may be implemented if top or bottom current sources are deemed to be critical. Top and bottom integrating gain boosted cascode circuits may be implemented together for improved performance (as shown in FIG. 1).

As shown in FIG. 3a, an integrating gain boosted cascode circuit 300 comprises two parallel current sources 168, an operational amplifier 310, capacitors C1 and C2, and parallel cascoded transistors 160. The parallel cascoded transistors 160 perform the function of completing a feedback loop to the operational amplifier 310, as well as using a differential correction voltage created at the operational amplifier 310 to increase an output resistance of the parallel cascoded transistors 160. The operational amplifier 310 may be a low-precision operational amplifier wherein constraints may be determined by input and output range limitations. The operational amplifier 310 may be commonly implemented with a folded cascode. The, two parallel current sources 168 are coupled to the operational amplifier 310 at an input stage. The output resistance of the two parallel current sources 168 is enhanced by the parallel cascoded transistors 160 and further enhanced by the operational amplifier 310.

Input currents I from the two parallel current sources 168 may combine with the optional input currents $I_{in}(+)$ and $I_{in}(-)$ as inputs to the operational amplifier 310. An output of the operational amplifier 310 is capacitively compensated via C1 and C2 to yield an output slew rate of a gain boosted cascode which is slower than a slew rate of a receiving signal to provide a time-averaged gain boosted voltage. The parallel cascoded transistors 160 yield a pair of output currents $I_{out}(+)$ and $I_{out}(-)$.

The integrating gain boosted cascode circuit 300 of FIG. 3a may be implemented as a folded cascode, unfolded cascode or other structure. For example, in FIG. 3b the integrating gain boosted cascode circuit 300 of FIG. 3a is shown implemented with a differential pair input circuit 164, a single current source 320, and two parallel current sources 324. The two parallel current sources 324 perform the function of an output load of an architecture where an output resistance may be substantially similar to a gain stage it is attached to. For the two parallel current sources 324 to have an output resistance similar to the gain stage it is attached to, the two parallel current sources 324 may themselves form an integrating gain boosted cascode circuit. The outputs of the two parallel current sources 324 and the integrating gain boosted cascode circuit 300 combine to produce a pair of output signals Vout(+) and Vout(−).

The differential pair input circuit 164 performs the function of a differential input voltage-to-current conversion observed in folded-cascode architectures, for example. The single current source 320 performs the function of a differential-pair current source. As shown in FIG. 1, the differential pair input circuit 164 is coupled to the integrating gain boosted cascode circuit 300. It should be noted that bias signals B8 and B9 may or not be equal.

Figure 4A:
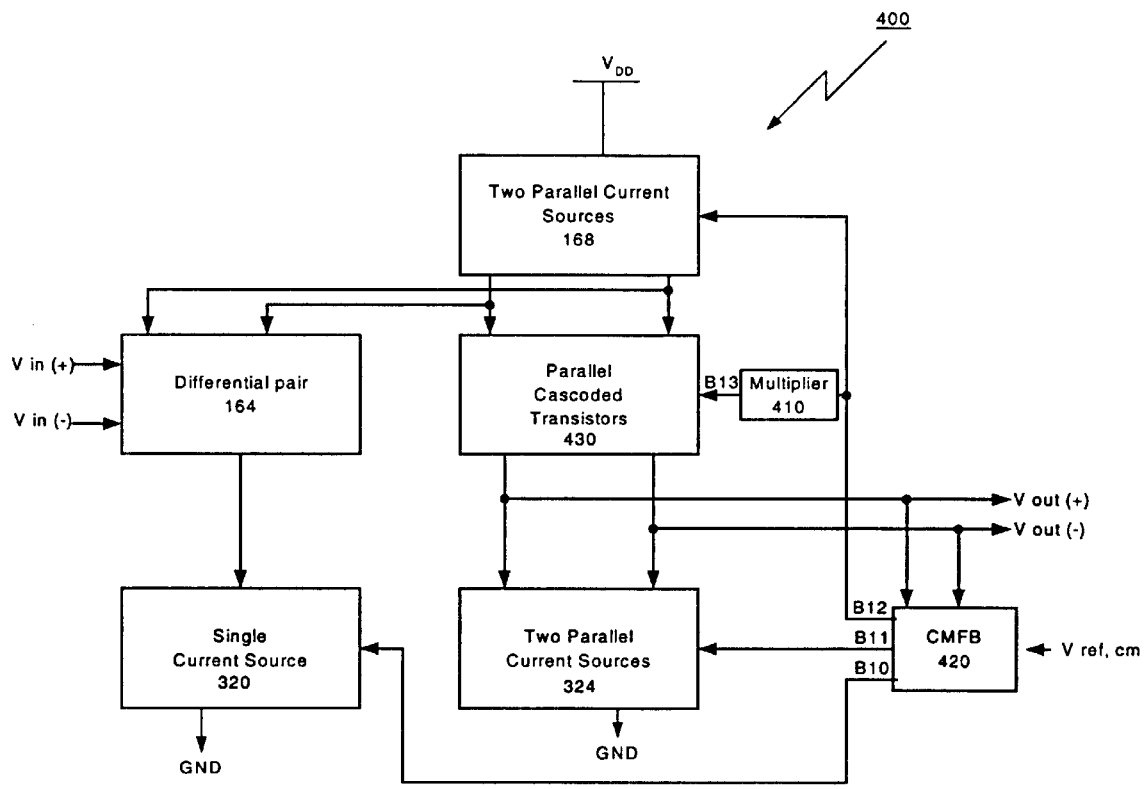
FIGS. 4a, 4b, and 4c show examples of multi-node common-mode feedback systems in accordance with the present invention.
Figure 4B:
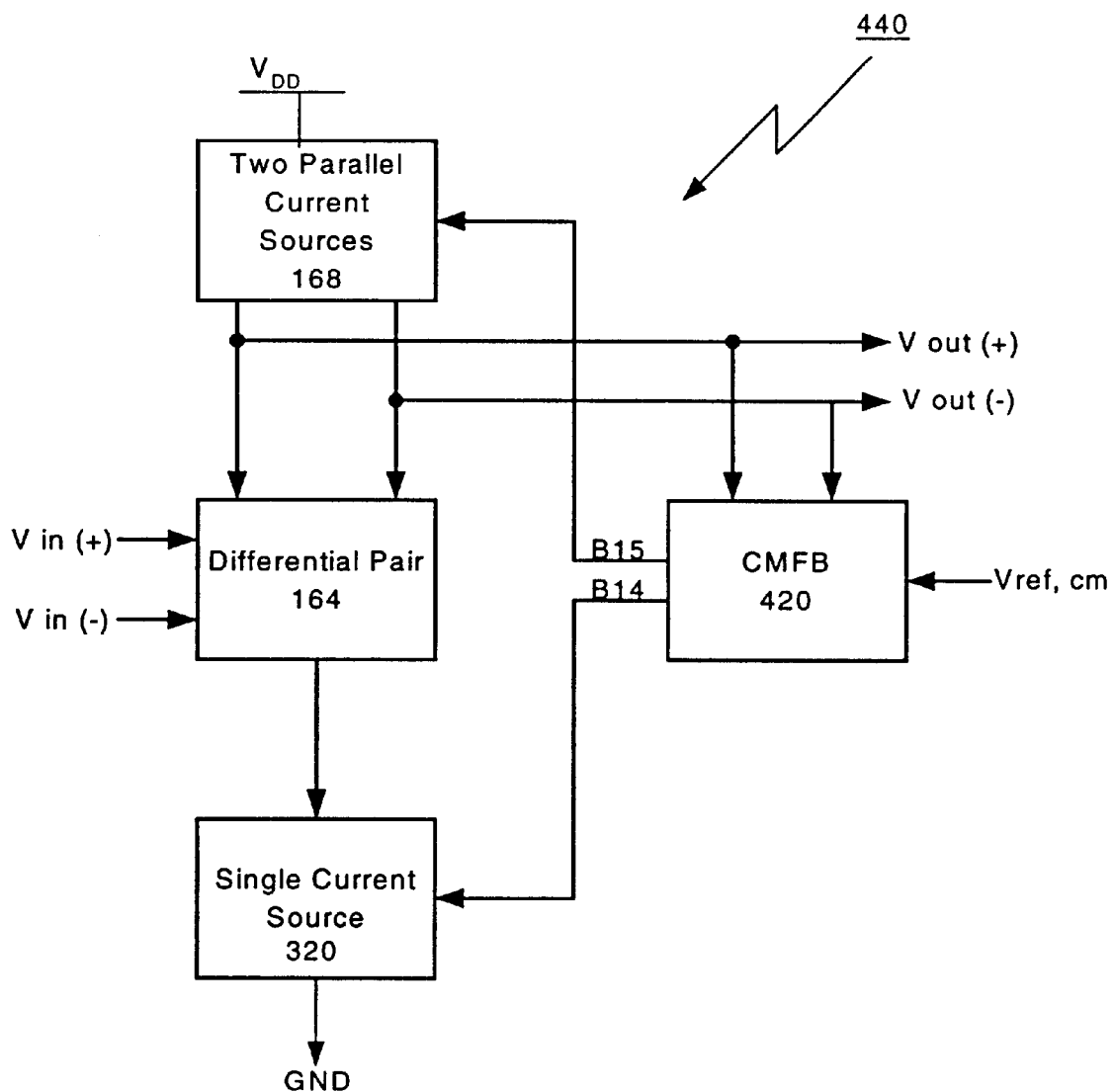
Figure 4C:
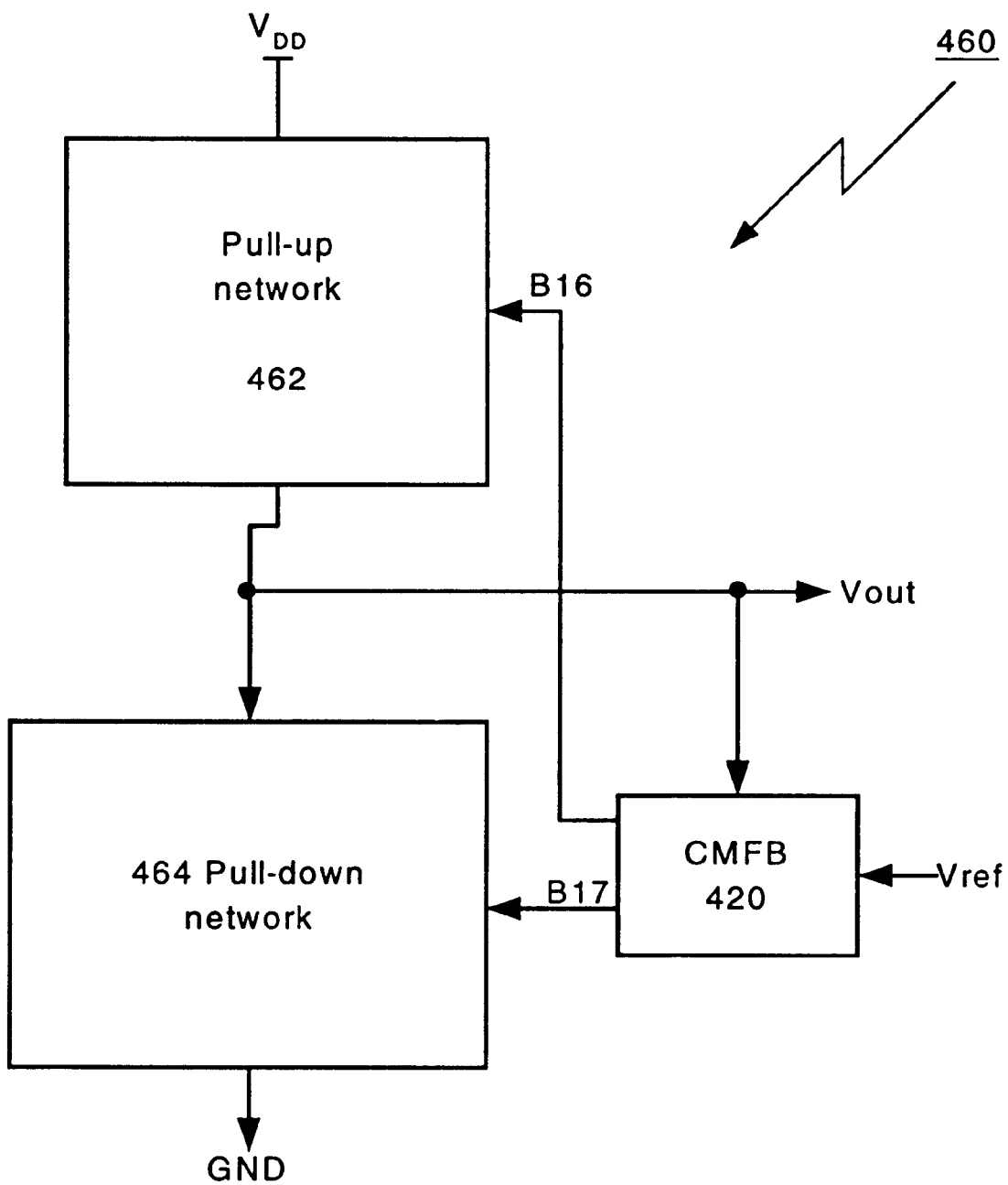

FIGS. 4a, 4b, and 4c show examples of multi-node common-mode feedback systems in accordance with the present invention. The common-mode feedback systems of FIGS. 4a, 4b, and 4c provide stable common-mode voltages for differential mode circuits. These common-mode feedback systems also minimize the offset of common-mode voltage thus further increasing the differential output range of attached circuits. Another advantage of these common-mode feedback systems is that they provide minimal voltage headroom. Because of large W/L ratios and double to single ended conversion, the observed error is much lower than observed in comparable conventional circuits.

When operating a circuit fully-differentially, a common-mode feedback circuit may be implemented for a stable and defined output common-mode. A simple desired common-mode of $\frac{1}{2}V_{DD}$ may be used. The error associated with the difference between a desired common-mode (Vref,cm) and an actual common-mode (Vcm) is, among other things, a function of the offset in current sources (e.g., current in a loop) and the gain of the common-mode feedback circuitry (e.g., V to I conversion).

To accomplish the V to I conversion, a double-differential common-mode feedback circuit may be used (e.g., a gilbert cell). Traditionally, either the input current or output current may be adjusted to control the common-mode of the circuit. A folded cascode circuit offers the ability to steer both the input current and the output current in the same direction to achieve a doubling of the current in the loop for correction thereby effectively reducing error between Vref,cm and Vcm in half. The folded cascode circuit may also have the potential of reducing the amount of bias voltages necessary in the circuit, thereby reducing area and saving power as additional benefits.

For low voltage circuits, any offset from a desired common-mode may constrain the headroom of the circuit. The offset is a function of the V to I conversion and the current in the loop, among other factors. The folded cascode circuit enables the input and output current sources to both be steered in the same direction to achieve the same polarity in the common-mode feedback response. As a result, the same (or substantially similar) common-mode feedback voltage may be used to decrease the offset in a desired common-mode. As the same bias voltage may be used, additional bias voltages may not be required, thereby saving power and area and providing other advantages.

In general, a multi-node common-mode feedback system may be defined as an op-amp structure with multiple input and output current branches where any two or more branches may be adjusted approximately simultaneously to achieve an increase of the current adjusted in the loop for common-mode correction to reduce dc offset.

Referring to FIG. 4a, a first multi-node common-mode feedback system 400 is shown in accordance with the present invention. The first multi-node common-mode feedback system 400 comprises a differential pair input circuit 164, two parallel current sources 168, a single current source 320, two parallel current sources 324, a multiplier circuit 410, a common-mode feedback circuit 420, and parallel cascoded transistors 430. The common-mode feedback circuit 420 generates bias signals B10, B11, and B12 for input to the single current source 320, the two parallel current sources 324, and the two parallel current sources 168 and the multiplier circuit 410, respectively.

Traditional common-mode feedback circuits generally provide only one bias signal to adjust itself dynamically to compensate for offsets in current sources. In contrast, in the first multi-node common-mode feedback system 400 of FIG. 4a, the common-mode feedback circuit 420 generates the three bias signals B10, B11, and B12, wherein bias signals B10 and B11 are dynamically adjusted at the same time and in the same direction, while bias signal B13 is typically fixed at a DC value. The multiplier circuit 410 generates a bias signal B13 for the parallel cascoded transistors 430. The bias signal B13 has a magnitude that is proportional to that of bias signal B12.

Additional reductions in DC offset may be accomplished by adjusting all three bias signals B10, B11, and B12, wherein B10 and B11 may be adjusted in the same direction and B12 may be adjusted in the opposite direction. Alternatively, bias signals B10, B11, and B12 may be controlled independently. Consequently, the two parallel current sources 168, the single current source 320, and the two parallel current sources 324 may convert the bias voltages into currents, thereby yielding the current sources.

The differential pair input circuit 164 performs the function of a V-to-I conversion on input signals Vin(+) and Vin(−). The parallel cascoded transistors 430 receive inputs from the differential pair input circuit 164 and the two parallel current sources 168. In response thereto, the parallel cascoded transistors 430 yield a pair of output signals Vout(+) and Vout(−). The output signals are coupled to the common-mode feedback circuit 420, which has an reference signal input of Vref,cm.

FIG. 4b shows a second multi-node common-mode feedback system 440 in accordance with the present invention. The second, multi-node common-mode feedback system 440 comprises a differential pair input circuit 164, two parallel current sources 168, a single current source 320, and a common-mode feedback circuit 420. The common-mode feedback circuit 420 generates bias signals B14 and B15 for input to the single current source 320 and the two parallel current sources 168, respectively. In this embodiment, bias signal B14 may be dynamically adjusted while bias signal B15 is fixed at a DC value. Alternatively, bias signal B14 may be adjusted in one direction while bias signal B15 is adjusted in the opposite direction. The two parallel current sources 168 and the single current source 320 may convert the bias voltages into currents, thus yielding the current sources.

The differential pair input circuit 164 performs the function of a V-to-I conversion. Output signals Vout(+) and Vout(−) from the two parallel current sources 168 and the differential pair input circuit 164 are coupled to the common-mode feedback circuit 420, which has a reference signal input of Vref,cm.

FIG. 4c shows a third multi-node common-mode feedback system 460 in accordance with the present invention. The third multi-node common-mode feedback system 460 comprises a pull-up network 462, a pull-down network 464, and a common-mode feedback circuit 420. The common-mode feedback circuit 420 generates bias signals B16 and B17, for input to the pull-up network 462 and the pull-down network 464, respectively. In this embodiment, bias signal B16 may be dynamically adjusted while bias signal B17 is fixed at a DC value. Alternatively, bias signal B16 may be adjusted in one direction while bias signal B17 is adjusted in the opposite direction.

A single-ended output signal Vout from the pull-up network 462 and the pull-down network 464 is coupled to the common-mode feedback circuit 420, which has a reference signal input of Vref.

When performing common-mode feedback on a cascoded current source, the potential exists that the cascode circuitry may drive the current source into a linear region. To mitigate this problem, the bias to the cascode circuitry may be derived from the common-mode feedback current, thereby maintaining the cascoded current source in a desired saturation region. This also has the potential of reducing the amount of bias voltages necessary in the circuit, thereby reducing area and saving power.

Also, when operating a transistor close to a linear region, small changes in the drain-to-source voltage (i.e., Vds) may result in large changes to its transconductance (i.e., gm). In order to ensure a cascoded current source stays in saturation, even when its current is changed dramatically, it may be desired to dynamically change the bias of the cascoded transistor. This may become more necessary at low $V_{DD}$.

Figure 5:
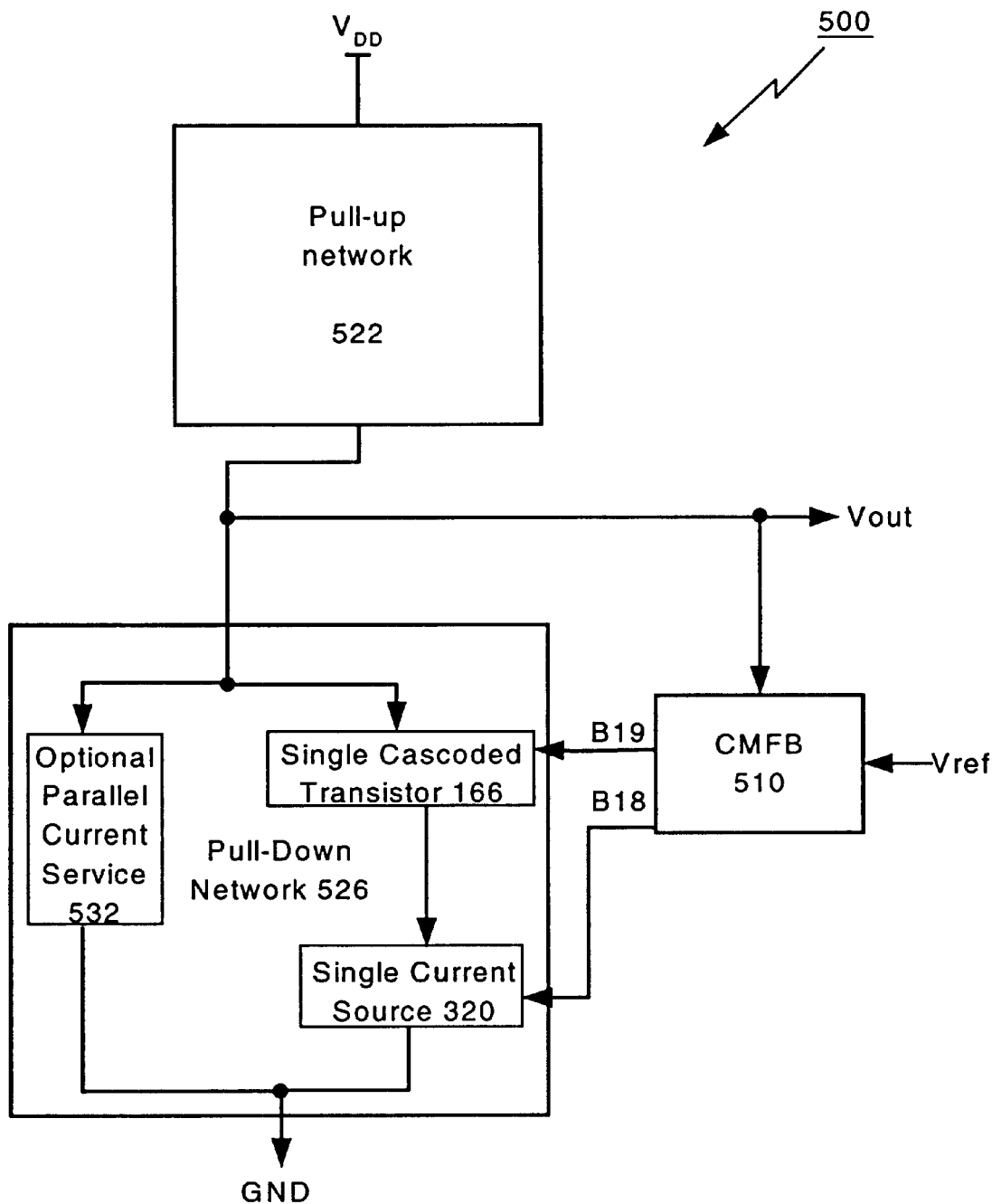
FIG. 5 shows a dynamic cascode common-mode feedback system in accordance with the present invention.

To address the aforementioned problems, the present invention provides dynamic cascode common-mode feedback circuitry. That is, referring to FIG. 5, there is shown a dynamic cascode common-mode feedback system 500 in accordance with the present invention. The dynamic cascode common-mode feedback system 500 comprises a pull-up network 522, a pull-down network 526, and a common-mode feedback circuit 510. The pull-up network 522 may be passive or active. For example, the pull-up network 522 may be implemented using transconductance circuitry. The pull-down network 526 typically includes at least a single current source 320 and a single cascoded transistor 166. The pull-down network 526 may also include an optional parallel current source 532.

Traditionally, common-mode feedback would be applied to only the single current source 320 through bias signal B18, while providing a fixed bias signal B19 to the single cascoded transistor 166. However, in accordance with the present invention, the common-mode feedback circuit 510 provides a dynamic bias signal B19 to the single cascoded transistor 166. This dynamic bias signal B19 varies with bias signal B18. As a result, greater range and linearity may be achieved for pull-down network 526. Similarly, this principle may be applied to systems wherein a pull-up network is adjusted, and a pull-down network is fixed.

More specifically, the common-mode feedback circuit 510 compares an output voltage Vout to an input reference voltage Vref. If the values of the voltages result in a difference, bias signals B18 and B19 are adjusted to bring the values of Vout and Vref closer together. Traditionally, the value of one of the bias signals (e.g., B18 or B19) is fixed. However, by adjusting the values of B18 and B19 simultaneously, the values of Vout and Vref may be more efficiently compensated. The pull-down network 526 receives bias signals B18 and B19 wherein the strength of a current source or the pull-down network 526 may be adjusted (e.g., increased or decreased) accordingly. The pull-down network 526 may affect an internal resistance to control the strength of the current. Thus, in the dynamic cascode common-mode feedback system 500 of FIG. 5, bias signal B19 is dynamically adjusted with bias signal B18.

Figure 6:
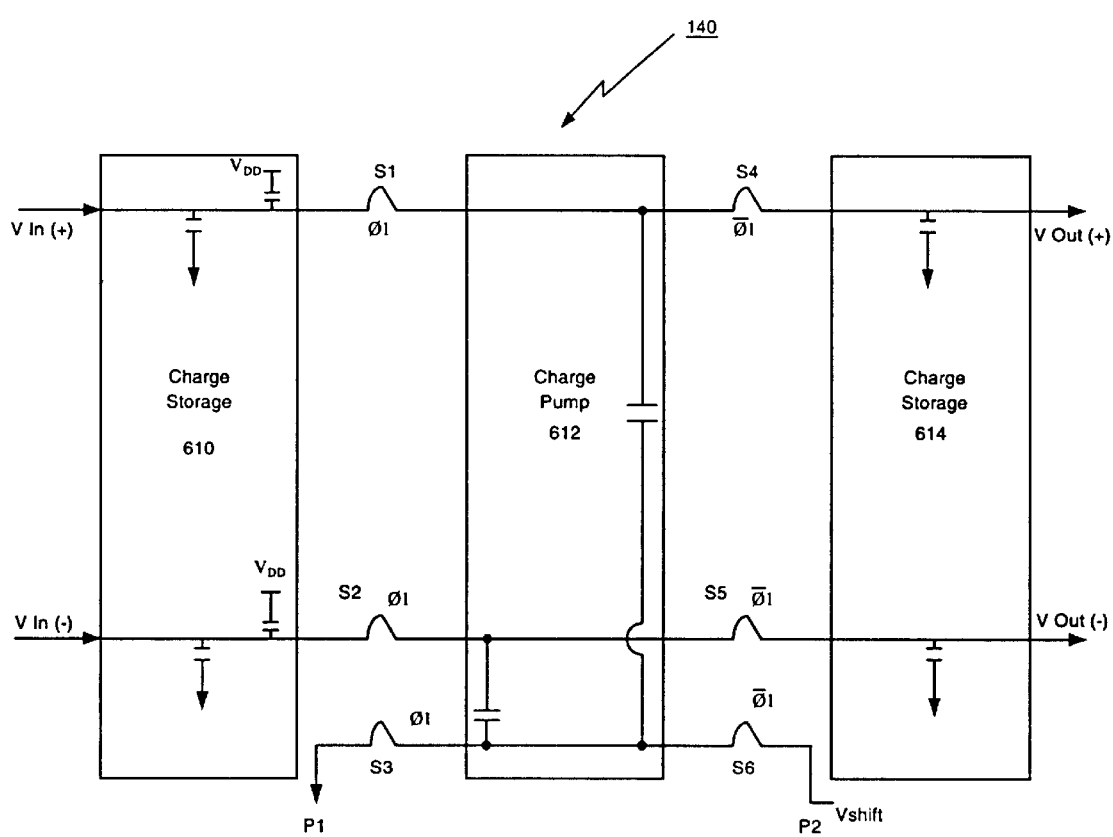
FIG. 6 shows an embodiment of a DC level shifter circuit in accordance with the present invention.

Referring to FIG. 6, there is shown an embodiment of a DC level shifter circuit 140 in accordance with the present invention. The DC level shifter circuit 140 comprises first charge storage circuitry 610, charge pump circuitry 612, and second charge storage circuitry 614. The first charge storage circuitry 610 receives differential inputs signals Vin(+) and Vin(−) and is coupled to the charge pump circuitry 612 through switches S1 and S2 operating at a phase of φ1. The first charge storage circuitry 610 performs the function of storing the charge associated with the differential inputs signals Vin(+) and Vin(−), thus maintaining a relatively fixed voltage.

The second charge storage circuitry 614 is coupled to and receives differential signals from the charge pump circuitry 612 through switches S4 and S5. The second charge storage circuitry 614 provides differential level shifted output signals Vout(+) and Vout(−). The second charge storage circuitry 614 performs the function of storing the charge associated with the differential level shifted output signals Vout(+) and Vout(−), Switches S1, S2, and S3 operate at a phase of φ1, and switches S4, S5, and S6 operate at an opposite phase of φ1. Switches S1, S2, S4, and S5 are typically pass-gates so as to allow charge to flow freely between the first charge storage circuitry 610, the charge pump circuitry 612, and the second charge storage circuitry 614 so as to establish an equilibrium.

A voltage reference P1 is coupled to the charge pump circuitry 612 through switch S3 and may be defined as $V_{DD}$ or GND depending on whether level-shifting down or up, respectively. A voltage reference P2 is coupled to the charge pump circuitry 612 through switch S6 and may be defined as an amount of voltage desired to be shifted, which may be defined by the difference between P1 and P2.

At low voltages, transistors may require at least a threshold voltage (Vt) to stay on. This may create problems for the capacitors and pass-gates if the common-mode is centered around $\frac{1}{2}V_{DD}$ and large output swings are desired. Since exactly equal capacitors are not necessarily needed to store the differential charge of an integrator, a combination of nmos and pmos capacitors may be used in the charge storage circuitry 610, for example, for a rail-to-rail operating range. Full pass-gates may then be used to transfer voltage to the charge pump circuitry 612. In particular, pmos pass-gates may be used to transfer the level-shifted voltage. A simple zerbo may be used to generate the differential CMOS clocks needed. It may be shown that the level-shifting capacitors are required to operate a $\frac{1}{2}V_{DD}$ range instead of the full $V_{DD}$ of the storing capacitors. Also, the value of the capacitors in the charge pump circuitry 612 may be a fraction of the capacitors in the charge storage circuitry. To achieve the desired operating range for the charge pump circuitry 612, for example, a metal-insulator-metal (MIM) capacitor or a depletion mode CMOS capacitor may be implemented for the capacitors in the charge pump circuitry 612.

The DC level shifter circuit 140 is useful because at low voltages a desired output common-mode of an integrator may be too low to ensure that a current source that drives a differential pair stays in saturation. The charge pump circuitry 612 is used to level shift an output of an integrator as well as a desired common-mode. Although a single-ended version may work, switching noise is reduced due to the differential nature of the correction voltage in a differential integrator.

Pass-gates are used instead of traditional diodes to enable charge to float until an equilibrium is established. An additional set of pass-gates may be used to reduce differential switching noise for the final output of the DC level shifter circuit 140. Because a delay element proportional to frequency is in the feed-forward path, switched cap biasing may be used to guarantee stability across a broad frequency range.

The charge pump circuitry 612 is used to create a voltage larger than the supply voltage $V_{DD}$. However, when used in this capacity, charge may be intentionally pulled from the voltage supply. Thus, a traditional charge pump may work in a different capacity than the DC level shifter circuit 140. In particular, the DC level shifter circuit 140 works more like an elaborate RC network, than a traditional charge pump. The floating gate of the shifting capacitor may push the voltage up and down. The charge moves around until an equilibrium is established. The final output voltage may actually perform the correction, and thus is in the loop so as to not introduce an error from the integrator. A high precision analog output is produced. The voltage applied to the floating gate may also be dynamically adjusted to ensure the output voltage is at a desired level.

When operating the DC level shifter circuit 140 at low voltages, Vt may approach $\frac{1}{2}V_{DD}$. This may require the common-mode of an incoming signal to be greater than $\frac{1}{2}V_{DD}$. Because of the differential nature of the signals, the charge pump circuitry 612 is used on both differential signals and the switching noise may be to a larger degree common-mode. As a result, a differential pair circuit may be less sensitive to noise from the charge pump circuitry 612.

Figure 7:
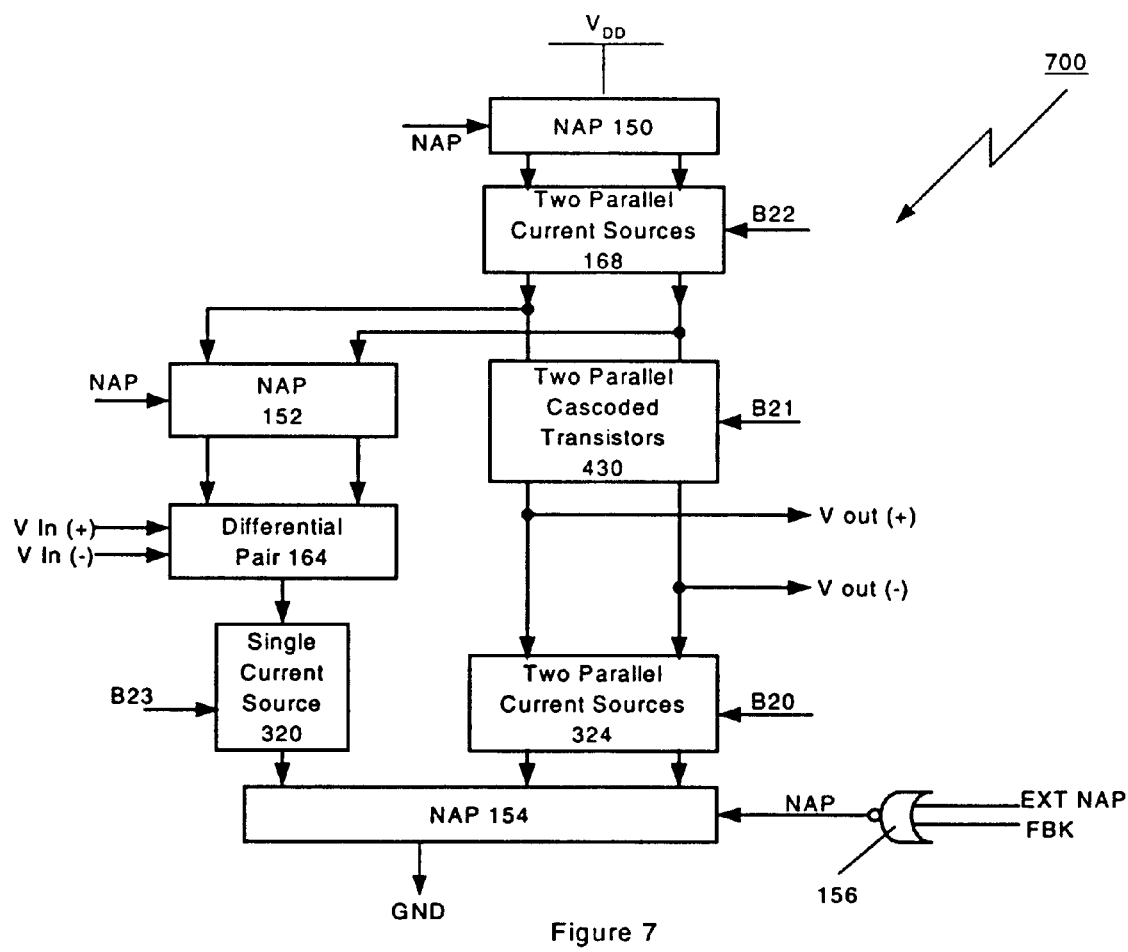
FIG. 7 illustrates the function of nap mode sleep and wake circuitry in a differential integrator in accordance with the present invention.

Referring to FIG. 7, the function of the NAP circuitry 150, 152, 154, and 156 is described as implemented with a differential integrator 700 in accordance with the present invention. The differential integrator 700 comprises the NAP circuitry 150, 152, 154, and 156, a differential pair input circuit 164, two parallel current sources 168, a single current source 320, two parallel current sources 324, and parallel cascoded transistors 430.

Figure 8:
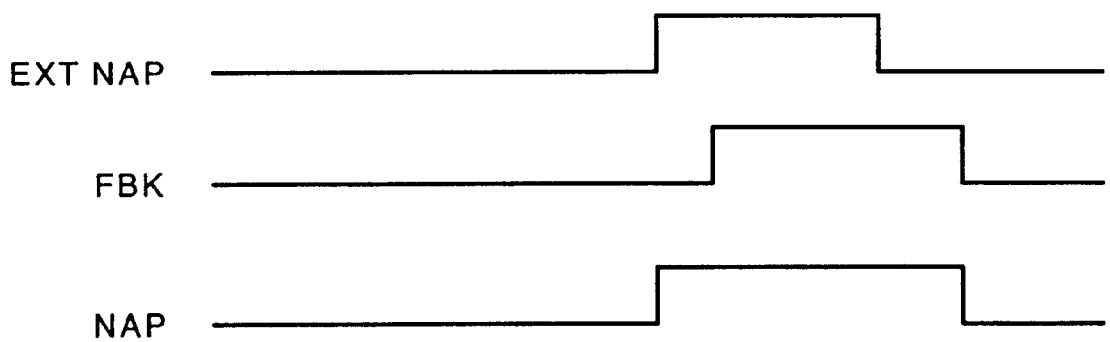
FIG. 8 shows the timing characteristics of a portion of nap mode sleep and wake circuitry in accordance with the present invention.

The NAP circuit 156 is a logic NOR gate for generating a NAP signal based upon the states of an external NAP signal (EXTNAP) and an external feedback signal (FBK). FIG. 8 shows the timing characteristics of the NAP circuit 156. That is, the external NAP signal (EXTNAP) and the external feedback signal (FBK) are logically NORed in the NAP circuit 156 to generate a resulting NAP signal. Having the external feedback signal (FBK) logically NORed with the external NAP signal (EXTNAP) ensures that data may be received by the differential integrator 700 before it is woken up.

Referring back to FIG. 7, the NAP signal is provided to NAP circuits 150, 152, and 154 so as to open circuit or short circuit current paths flowing therethrough. The NAP circuit 150 is coupled to the supply voltage $V_{DD}$ and to the two parallel current sources 168. The NAP circuit 152 is coupled to the differential pair input circuit 164, the two parallel current sources 168, and the parallel cascoded transistors 430. The NAP circuit 154 is coupled to the single current source 320, the two parallel current sources 324, and to GND.

The two parallel current sources 168 are coupled to the NAP circuits 152 and 154 and the parallel cascoded transistors 430. The two parallel current sources 168 receive a bias signal B22 as an input, and perform the function of two parallel current sources. The two parallel current sources 168 operate similar to a typical pull-up path to a positive power supply that may be broken for output charge storage during an off-state of the NAP circuitry 150, 152, 154, and 156.

The differential pair input circuit 164 is coupled to the NAP circuit 152 and the single current source 320. The differential pair input circuit 164 receives input signals Vin(+) and Vin(−), and performs the function of a differential pair. The differential pair input circuit 164 operates similar to a typical differential path that is coupled together and which may be broken for output charge storage during an off-state of the NAP circuitry 150, 152, 154, and 156.

The single current source 320 is coupled to the differential pair input circuit 164 and the NAP circuit 154. The single current source 320 receives a bias signal B23 as an input, and performs the function of a current source. The single current source 320 operates similar to a typical pull-down path to a negative power supply that may be broken for output charge storage during an off-state of the NAP circuitry 150, 152, 154, and 156.

The two parallel current sources 324 are coupled to the parallel cascoded transistors 430 and the NAP circuit 154. The two parallel current sources 324 receive a bias signal B20 as an input, and perform the function of a current source. The two parallel current sources 324 operate similar to a typical pull-down path to a negative power supply that may be broken for output charge storage during an off-state of the NAP circuitry 150, 152, 154, and 156.

The parallel cascoded transistors 430 are coupled to the two parallel current sources 168, the two parallel current sources 324, and the NAP circuit 152. The parallel cascoded transistors 430 receive a bias signal B21 as an input, and perform the function of a cascode circuit. The parallel cascoded transistors 430 operate in direct conjunction with two parallel current sources 324 to provide differential output signals Vout(+) and Vout(−).

Traditional nap mode sleep and wake circuits are significantly more elaborate. Such traditional circuits use two source-followers with matched level-shifts to create a feedback voltage roughly equal to a previous correction voltage. Since a nap mode sleep and wake circuit may use small foot transistors for other circuits, a modified approach according to an embodiment of the present invention is implemented.

As a large charge needs to be stored on capacitors inside the differential integrator 700, both pull-up and pull-down paths may be turned off by one or more foot transistors. Also, since the charge stored is differential in nature, a current path between two capacitors may be cut by placing at least one foot transistor on the differential path. As it takes a few clock cycles for the surrounding circuits to wake-up, the external feedback signal (FBK) may be NORed with the external NAP signal (EXTNAP) to ensure data is received by the differential integrator 700 before it is in a wake mode.

The NAP circuitry 150, 152, 154, and 156 may be used in other circuits, which may incorporate a switch to "break" a current path. To store the charge, another "break" in a pull-up path may be implemented. The NAP circuitry 150, 152, 154, and 156 of the present invention may effectively "break" a differential path at a differential pair, thereby allowing a differential charge to be stored during a nap mode. Additionally, the NAP circuitry 150, 152, 154, and 156 does not "wake" until after other circuits around it "wake" by using a delayed external feedback signal (FBK). The external feedback signal (FBK) may be a fixed delay or a dynamic signal that senses the inputs to the differential integrator 700.

The present invention NAP circuitry 150, 152, 154, and 156 is straight forward to implement. For example, current paths are cut during a nap mode, which include pull-up, pull-down and differential paths. Foot transistors are placed on nmos, pmos, and differential pairs. The external feedback signal (FBK) that is logically NORed with the external NAP signal (EXTNAP) is used to ensure clock/data is present before a wake-up mode.

Figure 9A:
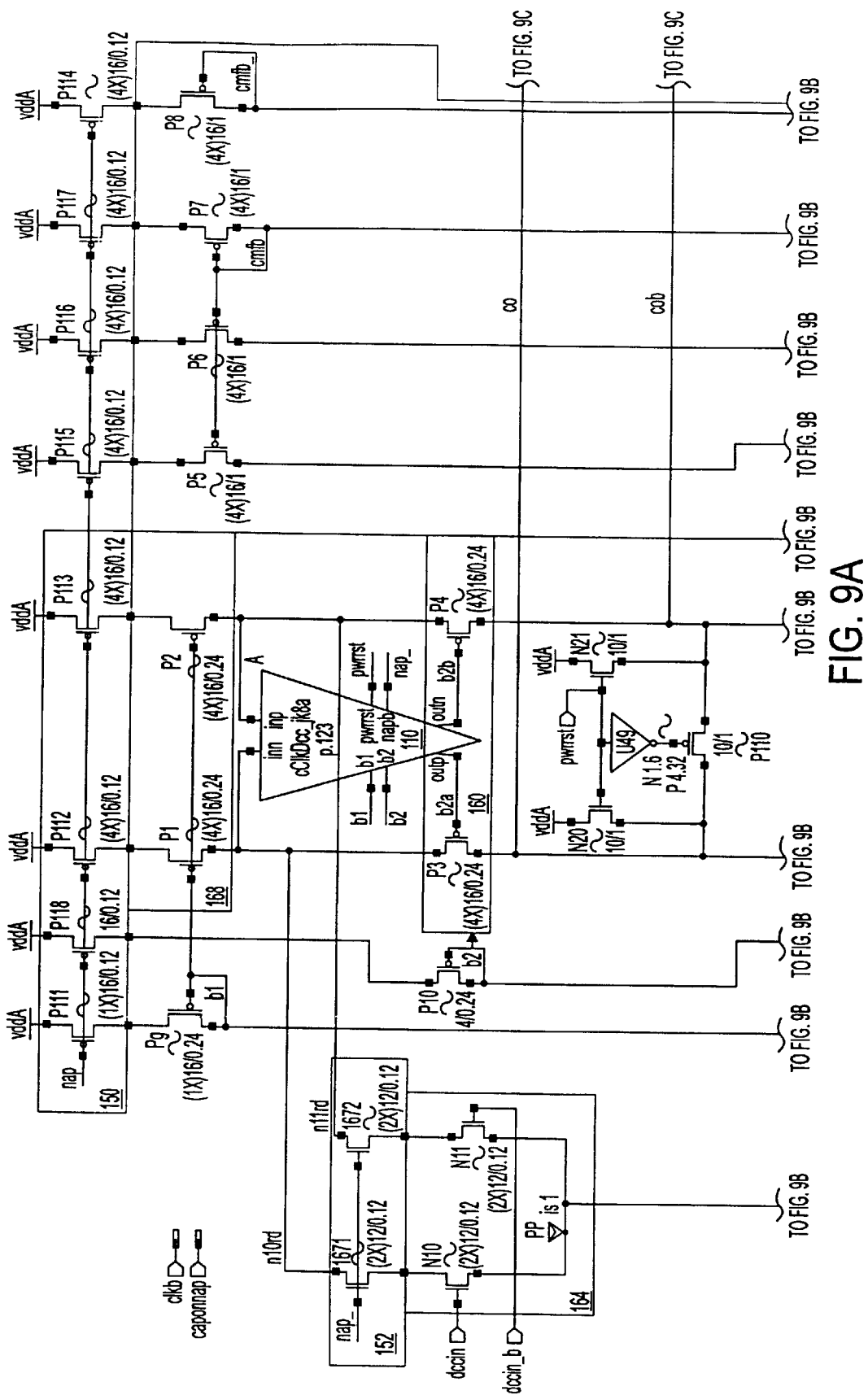
FIGS. 9A–9C show a detailed view of a differential integrator in accordance with the present invention.
Figure 9B:
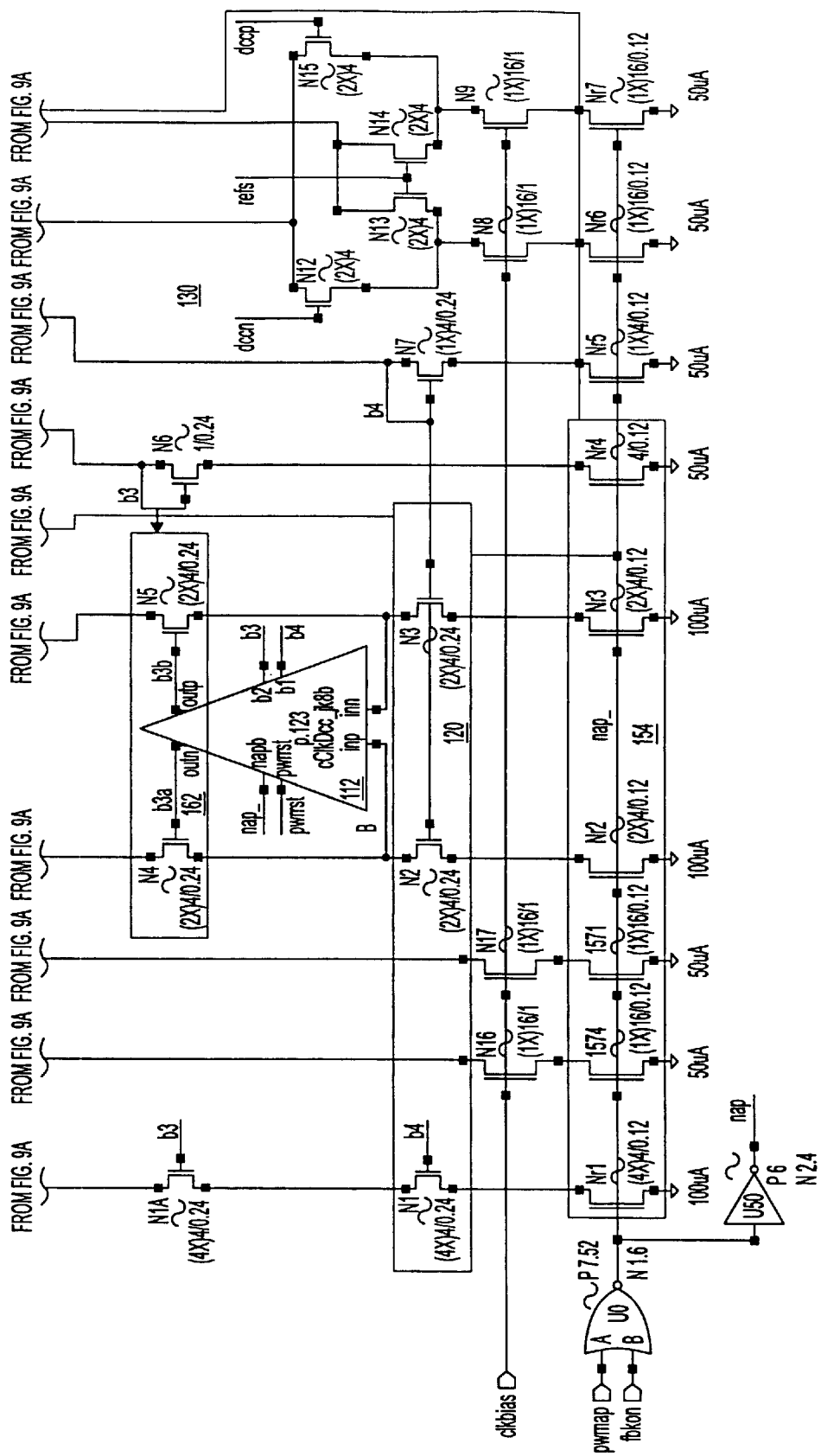
Figure 9C:
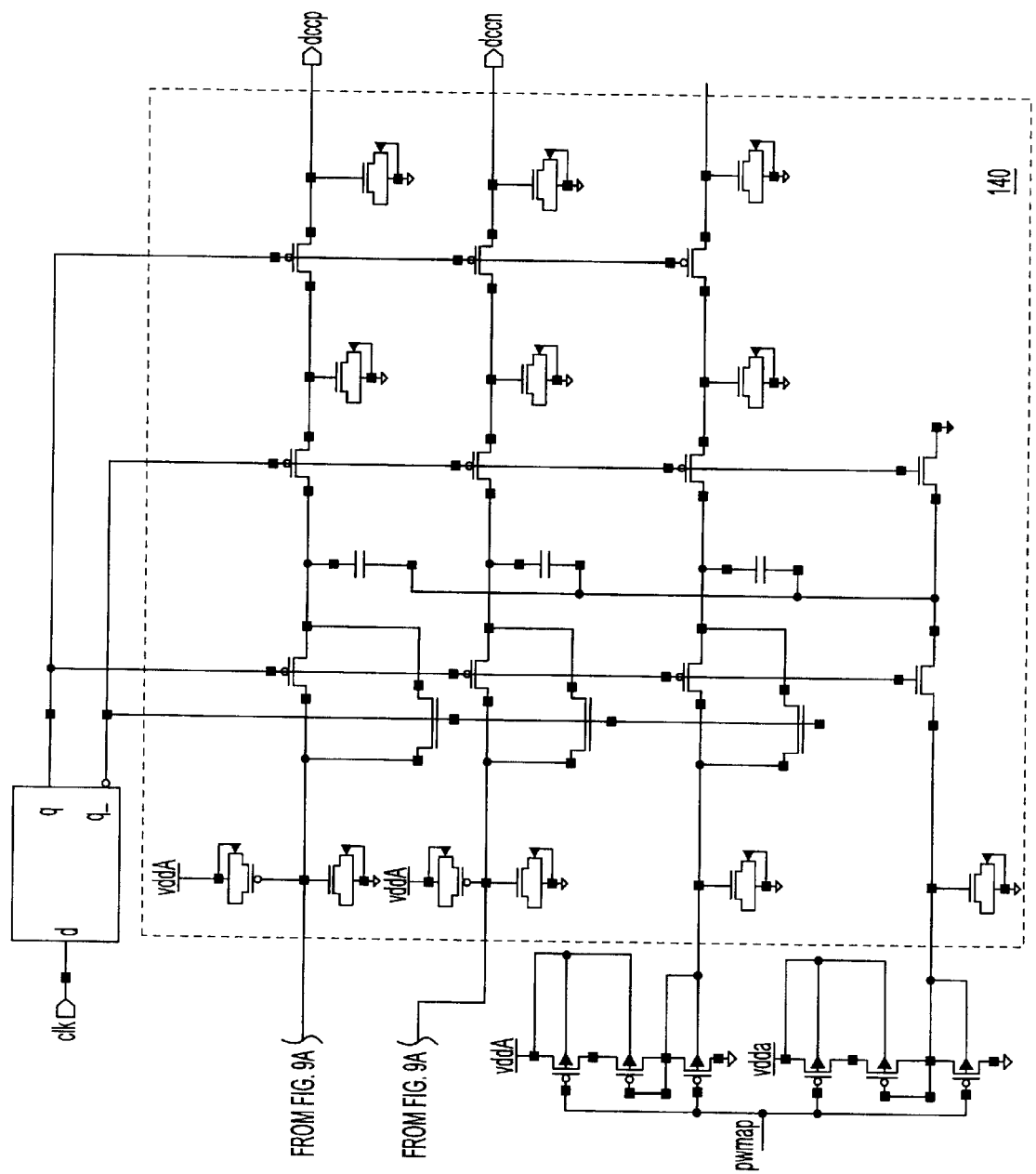

FIGS. 9A–9C show a detailed view of the differential integrator 100 of FIG. 1 in accordance with the present invention. Input signals are received by the differential pair input circuit 164. The NAP circuitry 150, 152, 154, and 156 provides the nap mode sleep and wake functionality. The two parallel current sources 168 function as ideal current sources. The two parallel current sources 168 are coupled to the operational amplifier 110, which provides outputs to the parallel cascoded transistors 160. The parallel cascoded transistors 160 function as cascoded current sources. Similarly, the multi-node CMFB circuit 120 functions as three parallel current sources. The multi-node CMFB circuit 120 is coupled to the operational amplifier 112, which provides outputs to the parallel cascoded transistors 162. The parallel cascoded transistors 162 function as cascoded current sources. The outputs of the parallel cascoded transistors 160 and the parallel cascoded transistors 162 are combined and provided as inputs to the DC level shifter circuit 140. The DC level shifter circuit 140 is coupled to the dynamic cascode CMFB circuit 130. The dynamic cascode CMFB circuit 130 outputs bias signals B2 and B3 the parallel cascoded transistors 162 and the multi-node CMFB circuit 120. The optional single cascoded transistor 166 is coupled between the differential pair input circuit 164 and the multi-node CMFB circuit 120.

The features of the present invention enable the lock time of a differential integrator to be much slower than a clock frequency. Additionally, because a frequency dependant bias may be used, the lock time of the differential integrator may now be proportional to frequency, rather than absolute time.

Figure 10:
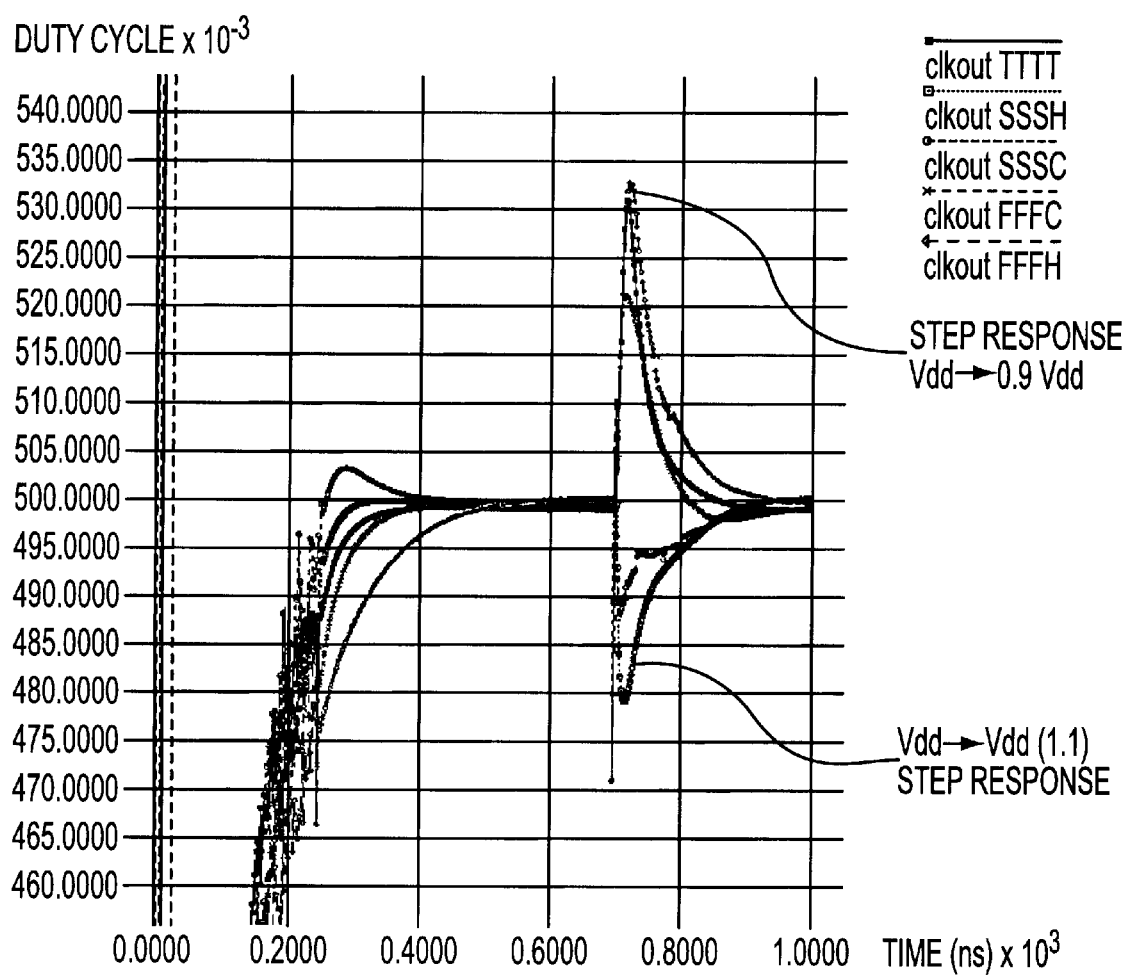
FIG. 10 is a graph illustrating duty cycle correction of a differential integrator in accordance with the present invention.

FIG. 10 is a graph illustrating duty cycle correction of a differential integrator in accordance with the present invention. FIG. 10 illustrates performance results of a differential integrator in accordance with the present invention. At a high frequency (e.g., 533 Mhz), the step response of the differential integrator is illustrated. At an upper limit, the supply voltage $V_{DD}$ is equal to $0.9V_{DD}$. At a lower limit, the step response is shown where $V_{DD}$ is equal to $1.1\ V_{DD}$.

Figure 11:
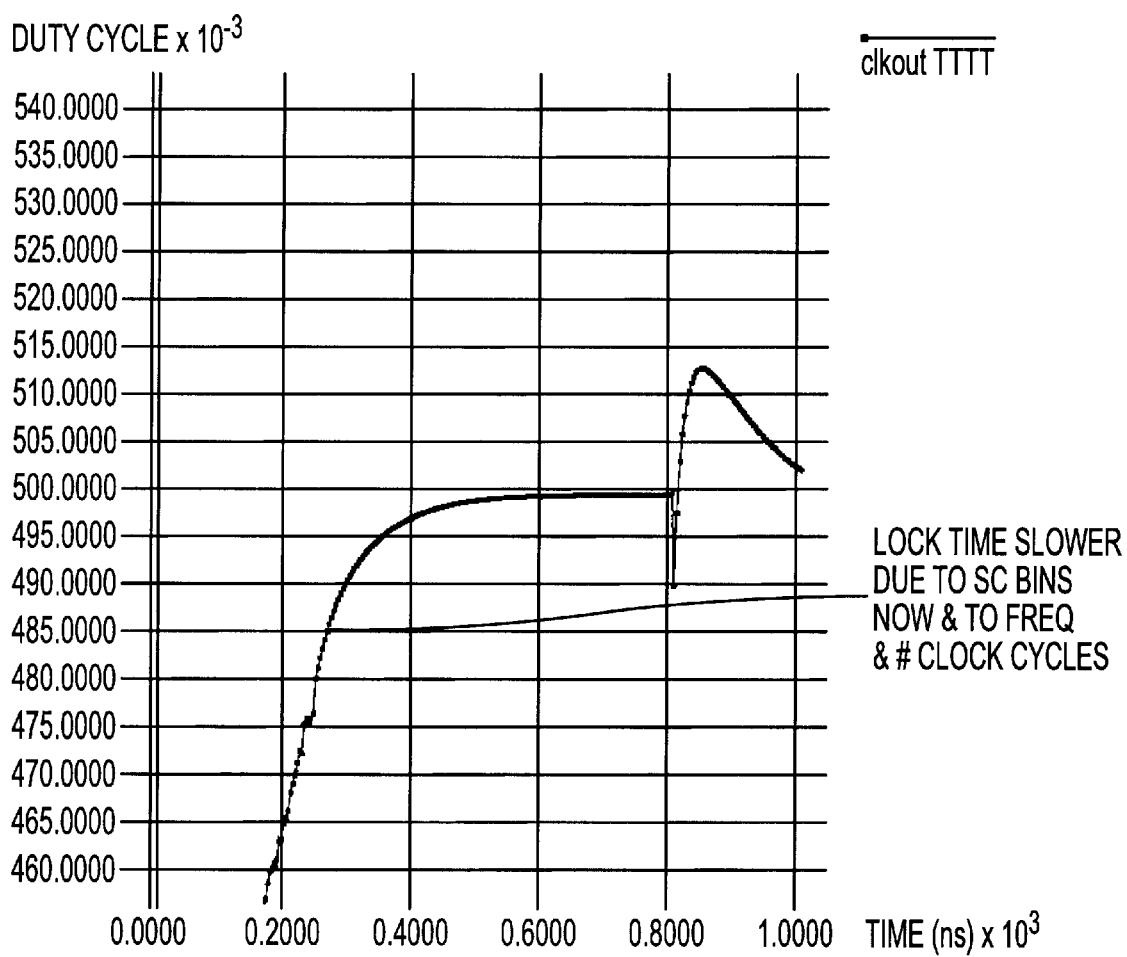
FIG. 11 is another graph illustrating duty cycle correction of a differential integrator in accordance with the present invention.

FIG. 11 is a graph illustrating duty cycle correction of a differential integrator in accordance with the present invention. FIG. 11 illustrates duty cycle correction at a lower frequency (e.g., 300 MHz). The lock time is illustrated as being lower due to a switched capacitor Bias. The lock time is further illustrated as being proportional to frequency as well as number of clock cycles, rather than absolute time.

Figure 12A:
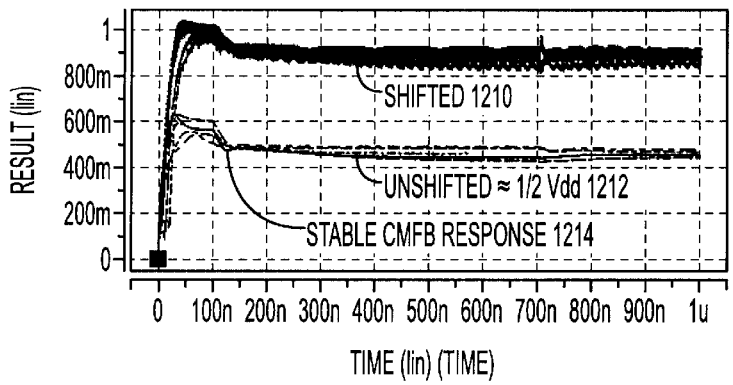
FIGS. 12a–12c are graphs illustrating internal node voltages of a differential integrator in accordance with the present invention.
Figure 12B:
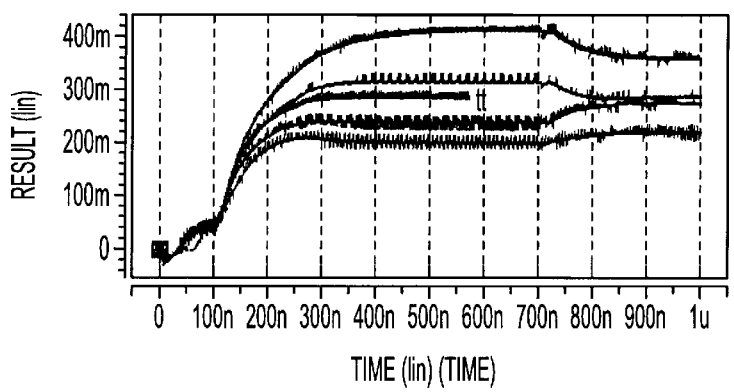
Figure 12C:
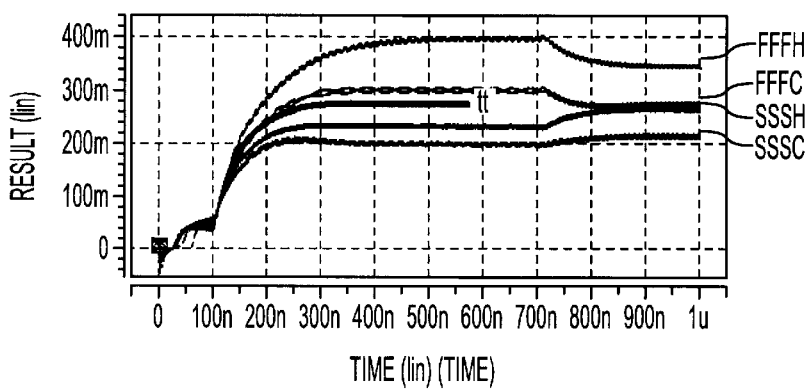

FIGS. 12a–12c are graphs illustrating internal node voltages of a differential integrator in accordance with the present invention. FIG. 12a illustrates normalized internal and level shifted common-mode at approximately 533 Mhz for a differential integrator of the present invention. Reference number 1210 represents shifted signals. Reference number 1212 represents un-shifted signals at approximately ½$V_{DD}$. At reference number 1214, a stable common-mode feedback response is illustrated. FIG. 12a illustrates the common-mode of two differential signals where the average is taken and normalized. FIG. 12b illustrates a level shifted differential output for a differential integrator of the present invention. FIG. 12c illustrates an internal (e.g., un-shifted) differential output for a differential integrator of the present invention.

Figure 13A:
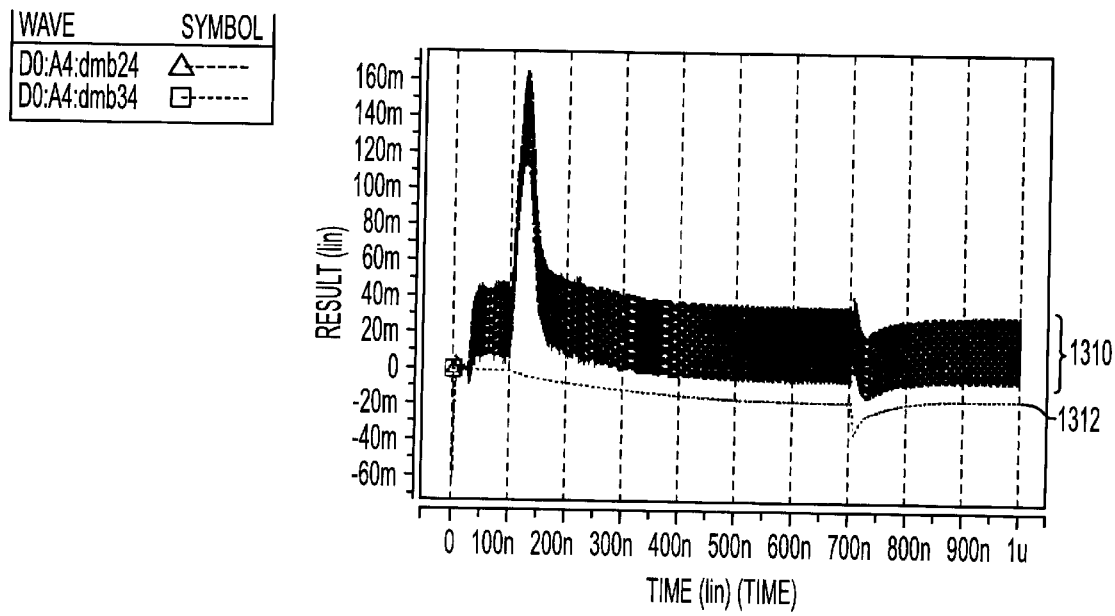
FIGS. 13a and 13b are graphs illustrating internal node voltages of a differential integrator in accordance with the present invention.
Figure 13B:
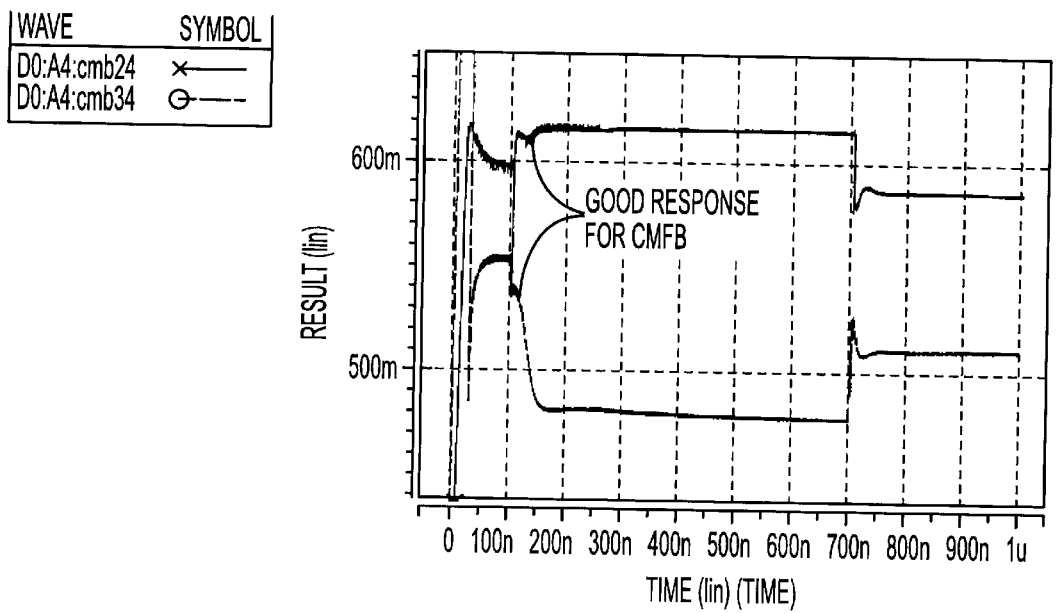

FIGS. 13a and 13b are graphs illustrating internal node voltages of a differential integrator in accordance with the present invention. FIG. 13a illustrates the largest integrating gain boosted cascode DM correction voltages. Signal 1310 represents a differential voltage from a top integrating gain boosted cascode circuit. Signal 1310 further illustrates a large degree of noise as well as switching back and forth of the signal at each clock cycle. The integrating gain boosted cascode circuitry of the present invention may be implemented to address the issue of noise associated with a normal gain boosted cascode. Signal 1312 represents differential voltage associated with a bottom integrating gain boosted cascode circuit from a constant current source. FIG. 13b illustrates the common-mode for the integrating gain boosted cascode circuit outputs, illustrated in FIG. 13a.

Figure 14:
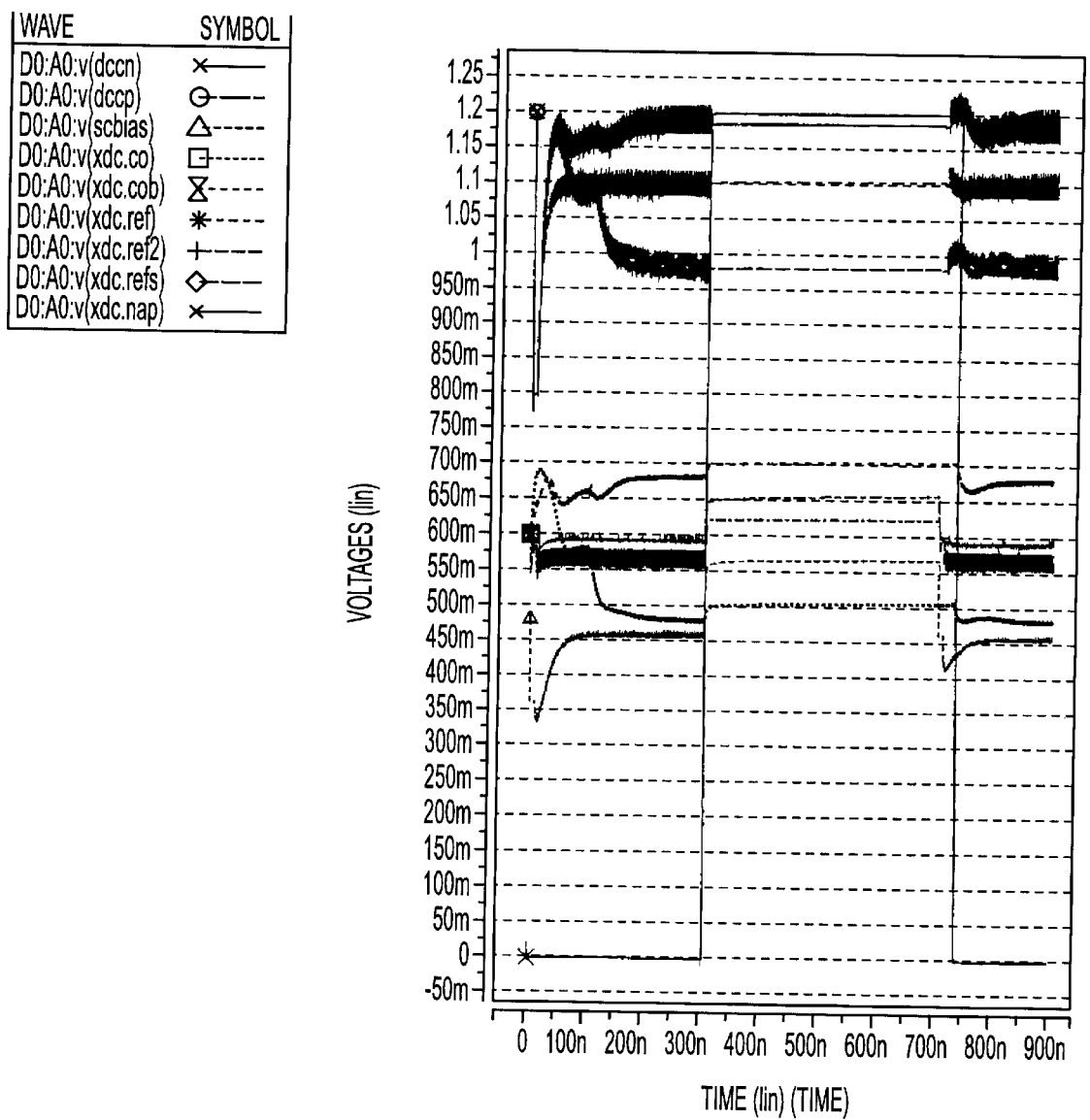
FIG. 14 is a graph illustrating internal node voltages associated with nap mode sleep and wake circuitry of a differential integrator in accordance with the present invention.

FIG. 14 is a graph illustrating internal node voltages associated with nap mode sleep and wake circuitry of a differential integrator in accordance with the present invention. FIG. 14 illustrates a nap output with a DC level shifter circuit. The nap mode sleep and wake circuitry of the present invention holds the voltage constant thereby enabling a quick lock when switched to an "on" mode. During nap mode, the voltage is held steady thereby enablings a quick recovery time.

Figure 15:
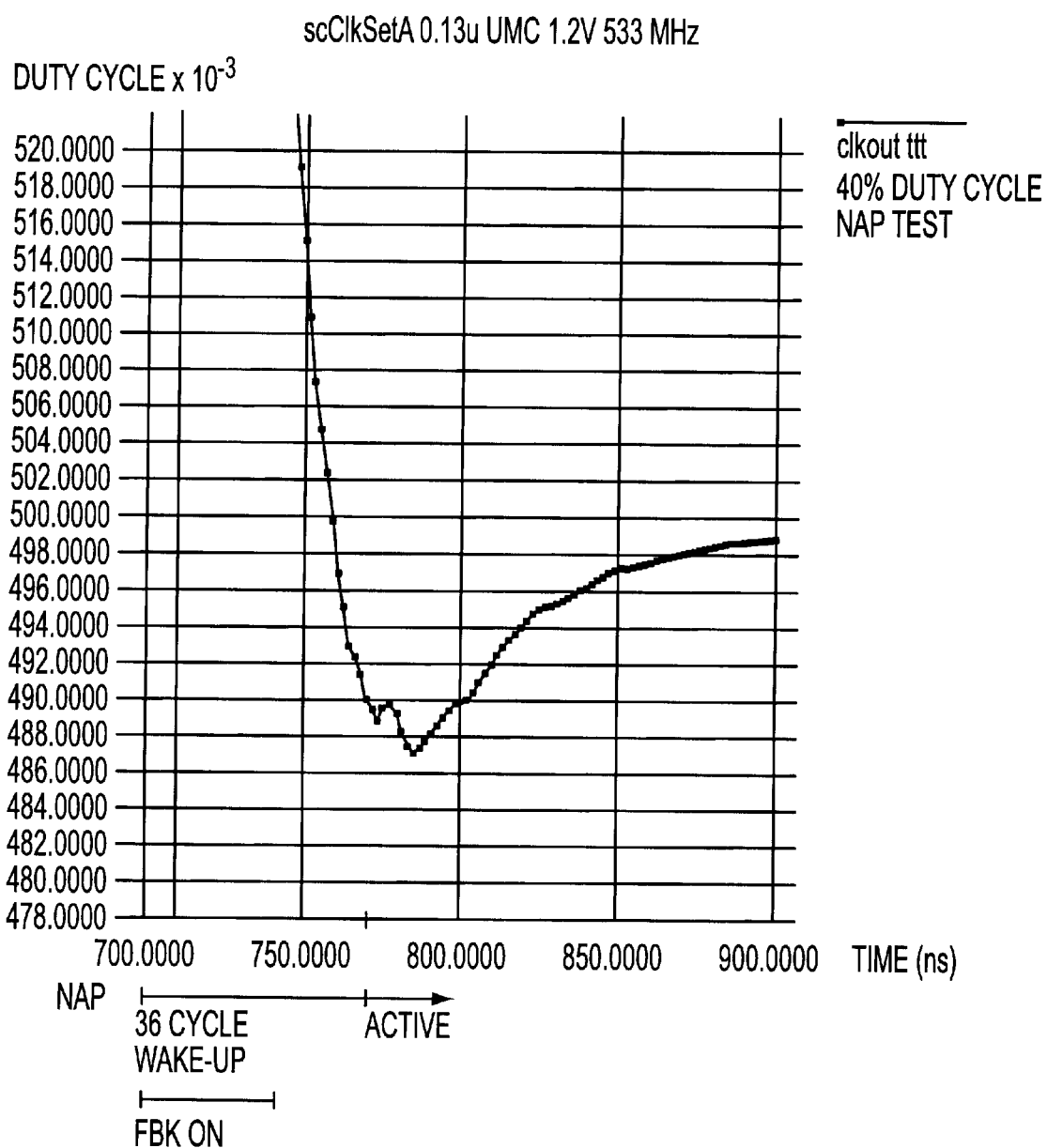
FIG. 15 is a graph illustrating duty cycle recovery associated with nap mode sleep and wake circuitry of a differential integrator in accordance with the present invention.

FIG. 15 is a graph illustrating duty cycle recovery associated with nap mode sleep and wake circuitry of a differential integrator in accordance with the present invention. FIG. 15 illustrates duty cycle recovery of nap mode sleep and wake circuitry of the present invention. At wake-up mode, the present invention nap mode sleep and wake circuitry avoids a long wakeup time because the voltage is held constant prior to wake-up mode.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. An improved differential integrator comprising:
    an integrating gain boosted cascode circuit for receiving an input signal having a bandwidth and for generating an output signal, the integrating gain boosted cascode circuit operating slower than the bandwidth of the input signal but faster than a lock time of the improved differential integrator so as to reduce offset in the output signal.

2. The improved differential integrator of claim 1, further comprising:
    a multi-node common-mode feedback circuit, coupled to the integrating gain boosted cascode circuit, for receiving at least one bias signal and for reducing offset in a desired common-mode of the output signal based thereon.

3. The improved differential integrator of claim 2, further comprising:
    a dynamic cascode common-mode feedback circuit, coupled to the integrating gain boosted cascode circuit and the multi-node common-mode feedback circuit, for comparing the output signal and a reference voltage and for generating the at least one bias signal in response thereto.

4. The improved differential integrator of claim 2, further comprising:
    a nap mode circuit, coupled to the integrating gain boosted cascode circuit and the multi-node common-mode feedback circuit, for receiving a feedback signal and a nap signal and for determining a sleep mode based thereon, wherein a differential charge associated with the output signal is stored during the sleep mode.

5. The improved differential integrator of claim 2, wherein the multi-node common-mode feedback circuit comprises:
    common-mode feedback circuitry for determining a difference between an input voltage and a reference voltage and for adjusting at least one current branch based on the difference; and
    at least one current source, coupled to the common-mode feedback circuitry, for receiving at least one current signal via the at least one current branch;
    wherein a first current branch and a second current branch are adjusted simultaneously to compensate for common-mode correction.

6. The improved differential integrator of claim 3, wherein the dynamic cascode common-mode feedback circuit comprises:
    common-mode feedback circuitry for receiving an input signal and a reference signal, for determining a difference between the input signal and the reference signal, and for generating a first bias signal for driving a cascoded current source and a second bias signal that varies dynamically with the first bias signal for driving a second current source based upon the difference.

7. The improved differential integrator of claim 4, wherein the nap mode circuit comprises:
    logic circuitry for receiving the nap signal and the feedback signal and for determining the sleep mode based thereon; and
    storage circuitry, coupled to the logic circuitry, for storing the differential charge by disconnecting a differential path during the sleep mode;
    wherein a differential voltage is held constant prior to a wake-up mode to shorten a wake-up time.

8. The improved differential integrator of claim 1, further comprising:
    a level shifter circuit, coupled to the integrating gain boosted cascode circuit, for level shifting the output signal so as to generate a level shifted output signal.

9. The improved differential integrator of claim 8, wherein the level shifter circuit comprises:
    first charge storage circuitry for receiving differential signals at an input node;
    charge pump circuitry, coupled to the first charge storage circuitry, for level shifting the differential signals and for generating level shifted differential signals;
    second charge storage circuitry, coupled to the charge pump circuitry, for storing the level shifted differential signals and for generating output signals to an output node based thereon; and
    at least one pair of switches coupled to the charge pump circuitry for enabling charge to flow between the input node and the output node so as to establish an equilibrium therebetween.

10. The improved differential integrator of claim 1, wherein the integrating gain boosted cascode circuit is a first integrating gain boosted cascode circuit, further comprising:
    a second integrating gain boosted cascode circuit, coupled to an output node of the first integrating gain boosted cascode circuit, for generating a pair of output signals.

11. The improved differential integrator of claim 1, wherein the integrating gain boosted cascode circuit comprises:
    a gain boosted cascode structure for receiving substantially equal input voltages and for generating a differential voltage to compensate for channel length modulation; and
    a capacitor compensation circuit, coupled to an output of the gain boosted cascode structure, for generating an output slew rate of the differential voltage which is slower than an input slew rate of the input voltages such that the differential voltage is a time-averaged gain boosted differential voltage.

12. An integrating gain boosted cascode circuit comprising:
   a gain boosted cascode structure for receiving substantially equal input voltages and for generating a differential voltage to compensate for channel length modulation; and
   a capacitor compensation circuit, coupled to an output of the gain boosted cascode structure, for generating an output slew rate of the differential voltage which is slower than an input slew rate of the input voltages such that the differential voltage is a time-averaged gain boosted differential voltage.

13. The integrating gain boosted cascode circuit of claim 12, further comprising:
   a cascode structure, coupled to an output node of the gain boosted cascode structure, for increasing output resistance of the gain boosted cascode structure.

14. The integrating gain boosted cascode circuit of claim 12, further comprising:
   a cascode structure, coupled to an output node of the gain boosted cascode structure, for providing a feedback path from the cascode structure to the gain boosted cascode structure.

15. The integrating gain boosted cascode circuit of claim 12, further comprising:
   a current source, coupled to an input node of the gain boosted cascode structure, for providing current to the gain boosted cascode structure.

16. The integrating gain boosted cascode circuit of claim 12, wherein the gain boosted cascode structure is a first gain boosted cascode structure, further comprising:
   a second gain boosted cascode structure, coupled to an output node of the first gain boosted cascode structure, for generating a pair of output signals.

17. The integrating gain boosted cascode circuit of claim 16, further comprising:
   a differential pair, coupled to an input node of the first gain boosted cascode structure, for providing a differential voltage-to-current conversion.

18. The integrating gain boosted cascode circuit of claim 12, wherein the gain boosted cascode structure comprises an op-amp.

19. The integrating gain boosted cascode circuit of claim 12, further comprising:
   a level shifter circuit, coupled to the output of the gain boosted cascode structure, for level shifting the differential voltage so as to generate a level shifted differential output signal.

20. A multi-node common-mode feedback circuit comprising:
   common-mode feedback circuitry for determining a difference between an input voltage and a reference voltage and for adjusting at least one current branch based on the difference; and
   at least one current source, coupled to the common-mode feedback circuitry, for receiving at least one current signal via the at least one current branch;
   wherein a first current branch and a second current branch are adjusted simultaneously to compensate for common-mode correction.

21. The multi-node common-mode feedback circuit of claim 20, further comprising:
   a first current source coupled to the first current branch;
   a second current source coupled to the second current branch; and
   a differential pair circuit, coupled to the first current source and the second current source, for providing voltage-to-current conversion.

22. The multi-node common-mode feedback circuit of claim 20, further comprising:
   a differential pair circuit, coupled to at least one of a first current source and a second current source, for generating a pair of output signals.

23. The multi-node common-mode feedback circuit of claim 22, wherein the pair of output signals are fed back to the common-mode feedback circuitry.

24. The multi-node common-mode feedback circuit of claim 20, wherein the first current branch is adjusted in a first direction and the second current branch is adjusted in a second direction substantially opposite to the first direction.

25. The multi-node common-mode feedback circuit of claim 20, wherein the first current branch and the second current branch are adjusted in a first direction.

26. The multi-node common-mode feedback circuit of claim 25, wherein the common-mode feedback circuit has a third current branch, further comprising:
   a current source coupled to the third current branch, wherein the third current branch is fixed at a predetermined DC value.

27. The multi-node common-mode feedback circuit of claim 25, wherein the common-mode feedback circuitry has a third current branch, further comprising:
   a current source coupled to the third current branch, wherein the third current branch is adjusted in a second direction substantially opposite to the first direction.

28. The multi-node common-mode feedback circuit of claim 20, wherein the common-mode feedback circuitry is implemented in a folded cascode structure.

29. The multi-node common-mode feedback circuit of claim 20, wherein the common-mode feedback circuitry is implemented in an op-amp structure.

30. A dynamic cascode common-mode feedback circuit comprising:
   common-mode feedback circuitry for receiving an input signal and a reference signal, for determining a difference between the input signal and the reference signal, and for generating a first bias signal for driving a cascoded current source and a second bias signal that varies dynamically with the first bias signal for driving a second current source based upon the difference.

31. The dynamic cascode common-mode feedback circuit of claim 30, wherein the cascoded current source operates in an operating region for a predetermined range of common-mode feedback bias.

32. The dynamic cascode common-mode feedback circuit of claim 30, wherein the cascoded current source is implemented in a pull-down network.

33. The dynamic cascode common-mode feedback circuit of claim 32, wherein the pull-down network circuitry is coupled to a pull-up network.

34. A nap mode circuit comprising:
   logic circuitry for receiving a nap signal and a feedback signal and for determining a sleep mode based thereon; and
   storage circuitry, coupled to the logic circuitry, for storing a differential charge by disconnecting a differential path during the sleep mode;
   wherein a differential voltage is held constant prior to a wake-up mode to shorten a wake-up time.

35. The nap mode circuit of claim 34, wherein the nap signal is logically NORed with the feedback signal to detect clock data presence before the wake-up mode.

36. The nap mode circuit of claim 34, further comprising:
at least one foot transistor for breaking the differential path.

37. A level shifter circuit for level shifting differential signals comprising:
first charge storage circuitry for receiving differential signals at an input node;
charge pump circuitry, coupled to the first charge storage circuitry, for level shifting the differential signals and for generating level shifted differential signals;
second charge storage circuitry, coupled to the charge pump circuitry, for storing the level shifted differential signals and for generating output signals to an output node based thereon; and
at least one pair of switches coupled to the charge pump circuitry for enabling charge to flow between the input node and the output node so as to establish an equilibrium therebetween.

38. The level shifter circuit of claim 37, wherein the at least one pair of switches are pass gates.

39. The level shifter circuit of claim 37, wherein the at least one pair of switches includes a first pair of switches coupled between the first charge storage circuitry and the charge pump circuitry and a second pair of switches coupled between the second charge storage circuitry and the charge pump circuitry.

40. The level shifter circuit of claim 39, wherein the first pair of switches operate with a first phase.

41. The level shifter circuit of claim 40, wherein the second pair of switches operate with a second phase substantially opposite to the first phase.

42. The level shifter circuit of claim 37, wherein the differential signals include first differential signals that are level shifted with common-mode noise.

43. The level shifter circuit of claim 37, wherein low-noise DC level shifted differential signals for low voltage applications.

44. The level shifter circuit of claim 37, wherein the charge pump circuitry has a linear capacitor for pumping the first charge storage circuitry.

45. The level shifter circuit of claim 44, wherein the linear capacitor is a metal-insulator-metal capacitor.

46. The level shifter circuit of claim 44, wherein the linear capacitor is a depletion mode CMOS capacitor.

47. The level shifter circuit of claim 37, wherein the first charge storage circuitry is voltage threshold insensitive charge storage circuitry.

48. The level shifter circuit of claim 37, wherein the first charge storage circuitry has at least one complementary CMOS gate capacitor.

49. The level shifter circuit of claim 37, wherein the first charge storage circuitry has at least one metal-insulator-metal capacitor.

50. The level shifter circuit of claim 37, wherein the first charge storage circuitry has at least one depletion-mode CMOS capacitor.

51. A method for reducing offset in a desired common-mode of an output signal of a differential integrator, the method comprising the steps of:
receiving an input signal having a bandwidth;
generating an output signal based upon the input signal, the output signal being generated slower than the bandwidth of the input signal but faster than a lock time of the differential integrator;
comparing the output signal and a reference voltage;
generating at least one bias signal based at least in part upon the comparison; and
reducing offset in a desired common-mode of the output signal based at least in part upon the at least one bias signal.

52. A method for generating a time-average gain boosted differential voltage in an integrating gain boosted cascode circuit, the method comprising the steps of:
receiving substantially equal input voltages;
generating a differential voltage, based upon the input voltages, to compensate for channel length modulation; and
generating an output slew rate of the differential voltage which is slower than an input slew rate of the input voltages such that the differential voltage is a time-averaged gain boosted differential voltage.

53. A method for compensating for common-mode correction in a multi-node common-mode feedback circuit, the method comprising the steps of:
determining a difference between an input voltage and a reference voltage;
adjusting at least one current branch based on the difference; and
receiving at least one current signal via the at least one current branch, wherein a first current branch and a second current branch are adjusted simultaneously to compensate for common-mode correction.

54. A method for generating a constant overdrive voltage in a dynamic cascode common-mode feedback circuit, the method comprising the steps of:
receiving an input signal and a reference signal;
determining a difference between the input signal and the reference signal, and
generating a first bias signal for driving a cascoded current source and a second bias signal that varies dynamically with the first bias signal for driving a second current source based upon the difference.

55. A method for implementing a nap circuit, the method comprising the steps of:
receiving a nap signal and a feedback signal;
determining a sleep mode based upon the nap signal and the feedback signal; and
storing a differential charge by disconnecting a differential path during the sleep mode, wherein a differential voltage is held constant prior to a wake-up mode to shorten a wake-up time.

56. A method for level shifting differential signals, the method comprising the steps of:
receiving differential signals at an input node;
level shifting the differential signals;
storing the level shifted differential signals;
generating output signals to an output node based upon the stored level shifted differential signals; and
enabling charge to flow between the input node and the output node so as to establish an equilibrium therebetween.

* * * * *